US010303390B1

(12) United States Patent
Colgrove et al.

(10) Patent No.: US 10,303,390 B1
(45) Date of Patent: May 28, 2019

(54) RESOLVING FINGERPRINT COLLISIONS IN FLASH STORAGE SYSTEM

(71) Applicant: Pure Storage, Inc., Mounain View, CA (US)

(72) Inventors: John Colgrove, Los Altos, CA (US); Ronald Karr, Palo Alto, CA (US); Ethan Miller, Santa Cruz, CA (US)

(73) Assignee: Pure Storage, Inc., Mountain View, CA (US)

( * ) Notice: Subject to any disclaimer, the term of this patent is extended or adjusted under 35 U.S.C. 154(b) by 0 days.

(21) Appl. No.: 15/581,660

(22) Filed: Apr. 28, 2017

Related U.S. Application Data

(60) Provisional application No. 62/468,348, filed on Mar. 7, 2017, provisional application No. 62/330,736, filed on May 2, 2016.

(51) Int. Cl.
*G06F 3/00* (2006.01)
*G06F 3/06* (2006.01)
*H03M 13/15* (2006.01)
*G06F 11/10* (2006.01)

(52) U.S. Cl.
CPC ............ *G06F 3/0641* (2013.01); *G06F 3/067* (2013.01); *G06F 3/0608* (2013.01); *G06F 11/1076* (2013.01); *H03M 13/154* (2013.01)

(58) Field of Classification Search
None
See application file for complete search history.

(56) References Cited

U.S. PATENT DOCUMENTS

| 5,706,210 A | 1/1998 | Kumano et al. |
| 5,799,200 A | 8/1998 | Brant et al. |
| 5,933,598 A | 8/1999 | Scales et al. |
| 6,012,032 A | 1/2000 | Donovan et al. |

(Continued)

FOREIGN PATENT DOCUMENTS

| EP | 0725324 A2 | 8/1996 |
| WO | WO-2012/087648 A1 | 6/2012 |

(Continued)

OTHER PUBLICATIONS

Sweere, *Creating Storage Class Persistent Memory with NVD/MM*, Published in Aug. 2013, Flash Memory Summit 2013, <http://ww.flashmemorysummit.com/English/Collaterals/Proceedings/2013/20130814_T2_Sweere.pdf>, 22 pages.

(Continued)

*Primary Examiner* — Midys Rojas

(57) ABSTRACT

Handling fingerprint collisions in a storage system that includes one or more storage devices, including: determining whether a fingerprint associated with a first data segment matches a fingerprint associated with a data segment stored within the storage system; responsive to determining that the fingerprint associated with the first data segment matches the fingerprint associated with the data segment stored within the storage system, determining whether the first data segment matches the data segment stored within the storage system; and responsive to determining that the first data segment does not match the data segment stored within the storage system, resolving a fingerprint collision between the first data segment and the data segment stored within the storage system.

20 Claims, 19 Drawing Sheets

(56) References Cited

U.S. PATENT DOCUMENTS

| | | | |
|---|---|---|---|
| 6,085,333 | A | 7/2000 | DeKoning et al. |
| 6,643,641 | B1 | 11/2003 | Snyder |
| 6,647,514 | B1 | 11/2003 | Umberger et al. |
| 6,789,162 | B1 | 9/2004 | Talagala et al. |
| 7,089,272 | B1 | 8/2006 | Garthwaite et al. |
| 7,107,389 | B2 | 9/2006 | Inagaki et al. |
| 7,146,521 | B1 | 12/2006 | Nguyen |
| 7,334,124 | B2 | 2/2008 | Pham et al. |
| 7,437,530 | B1 | 10/2008 | Rajan |
| 7,493,424 | B1 | 2/2009 | Bali et al. |
| 7,669,029 | B1 | 2/2010 | Mishra et al. |
| 7,689,609 | B2 | 3/2010 | Lango et al. |
| 7,743,191 | B1 | 6/2010 | Liao |
| 7,899,780 | B1 | 3/2011 | Shmuylovich et al. |
| 8,042,163 | B1 | 10/2011 | Karr et al. |
| 8,086,585 | B1 | 12/2011 | Brashers et al. |
| 8,271,700 | B1 | 9/2012 | Annem et al. |
| 8,387,136 | B2 | 2/2013 | Lee et al. |
| 8,437,189 | B1 | 5/2013 | Montierth et al. |
| 8,465,332 | B2 | 6/2013 | Hogan et al. |
| 8,527,544 | B1 | 9/2013 | Colgrove et al. |
| 8,566,546 | B1 | 10/2013 | Marshak et al. |
| 8,578,442 | B1 | 11/2013 | Banerjee |
| 8,613,066 | B1 | 12/2013 | Brezinski et al. |
| 8,620,970 | B2 | 12/2013 | English et al. |
| 8,751,463 | B1 | 6/2014 | Chamness |
| 8,762,642 | B2 | 6/2014 | Bates et al. |
| 8,769,622 | B2 | 7/2014 | Chang et al. |
| 8,800,009 | B1 | 8/2014 | Beda, III et al. |
| 8,812,860 | B1 | 8/2014 | Bray |
| 8,850,546 | B1 | 9/2014 | Field et al. |
| 8,898,346 | B1 | 11/2014 | Simmons |
| 8,909,854 | B2 | 12/2014 | Yamagishi et al. |
| 8,931,041 | B1 | 1/2015 | Banerjee |
| 8,949,863 | B1 | 2/2015 | Coatney et al. |
| 8,984,602 | B1 | 3/2015 | Bailey et al. |
| 8,990,905 | B1 | 3/2015 | Bailey et al. |
| 9,124,569 | B2 | 9/2015 | Hussain et al. |
| 9,134,922 | B2 | 9/2015 | Rajagopal et al. |
| 9,141,301 | B1* | 9/2015 | Wallace ............... G06F 3/0641 |
| 9,209,973 | B2 | 12/2015 | Aikas et al. |
| 9,250,823 | B1 | 2/2016 | Kamat et al. |
| 9,300,660 | B1 | 3/2016 | Borowiec et al. |
| 9,444,822 | B1 | 9/2016 | Borowiec et al. |
| 9,507,532 | B1 | 11/2016 | Colgrove et al. |
| 2002/0013802 | A1 | 1/2002 | Mori et al. |
| 2003/0145172 | A1 | 7/2003 | Galbraith et al. |
| 2003/0191783 | A1 | 10/2003 | Wolczko et al. |
| 2003/0225961 | A1 | 12/2003 | Chow et al. |
| 2004/0080985 | A1 | 4/2004 | Chang et al. |
| 2004/0111573 | A1 | 6/2004 | Garthwaite |
| 2004/0153844 | A1 | 8/2004 | Ghose et al. |
| 2004/0193814 | A1 | 9/2004 | Erickson et al. |
| 2004/0260967 | A1 | 12/2004 | Guha et al. |
| 2005/0160416 | A1 | 7/2005 | Jamison |
| 2005/0188246 | A1 | 8/2005 | Emberty et al. |
| 2005/0216800 | A1 | 9/2005 | Bicknell et al. |
| 2006/0015771 | A1 | 1/2006 | Van Gundy et al. |
| 2006/0129817 | A1 | 6/2006 | Borneman et al. |
| 2006/0161726 | A1 | 7/2006 | Lasser |
| 2006/0230245 | A1 | 10/2006 | Gounares et al. |
| 2006/0239075 | A1 | 10/2006 | Williams et al. |
| 2007/0022227 | A1 | 1/2007 | Miki |
| 2007/0028068 | A1 | 2/2007 | Golding et al. |
| 2007/0055702 | A1 | 3/2007 | Fridella et al. |
| 2007/0109856 | A1 | 5/2007 | Pellicone et al. |
| 2007/0150689 | A1 | 6/2007 | Pandit et al. |
| 2007/0168321 | A1 | 7/2007 | Saito et al. |
| 2007/0220227 | A1 | 9/2007 | Long |
| 2007/0294563 | A1 | 12/2007 | Bose |
| 2007/0294564 | A1 | 12/2007 | Reddin et al. |
| 2008/0005587 | A1 | 1/2008 | Ahlquist |
| 2008/0077825 | A1 | 3/2008 | Bello et al. |
| 2008/0162674 | A1 | 7/2008 | Dahiya |
| 2008/0195833 | A1 | 8/2008 | Park |
| 2008/0270678 | A1 | 10/2008 | Cornwell et al. |
| 2008/0282045 | A1 | 11/2008 | Biswas et al. |
| 2009/0077340 | A1 | 3/2009 | Johnson et al. |
| 2009/0100115 | A1 | 4/2009 | Park et al. |
| 2009/0198889 | A1 | 8/2009 | Ito et al. |
| 2010/0052625 | A1 | 3/2010 | Cagno et al. |
| 2010/0211723 | A1 | 8/2010 | Mukaida |
| 2010/0246266 | A1 | 9/2010 | Park et al. |
| 2010/0257142 | A1 | 10/2010 | Murphy et al. |
| 2010/0262764 | A1 | 10/2010 | Liu et al. |
| 2010/0325345 | A1 | 12/2010 | Ohno et al. |
| 2010/0332754 | A1 | 12/2010 | Lai et al. |
| 2011/0072290 | A1 | 3/2011 | Davis et al. |
| 2011/0125955 | A1 | 5/2011 | Chen |
| 2011/0131231 | A1 | 6/2011 | Haas et al. |
| 2011/0167221 | A1 | 7/2011 | Pangal et al. |
| 2012/0023144 | A1 | 1/2012 | Rub |
| 2012/0054264 | A1 | 3/2012 | Haugh et al. |
| 2012/0079318 | A1 | 3/2012 | Colgrove et al. |
| 2012/0131253 | A1 | 5/2012 | McKnight et al. |
| 2012/0303919 | A1 | 11/2012 | Hu et al. |
| 2012/0311000 | A1 | 12/2012 | Post et al. |
| 2013/0007845 | A1 | 1/2013 | Chang et al. |
| 2013/0031414 | A1 | 1/2013 | Dhuse et al. |
| 2013/0036272 | A1 | 2/2013 | Nelson |
| 2013/0071087 | A1 | 3/2013 | Motiwala et al. |
| 2013/0145447 | A1 | 6/2013 | Maron |
| 2013/0191555 | A1 | 7/2013 | Liu |
| 2013/0198459 | A1 | 8/2013 | Joshi et al. |
| 2013/0205173 | A1 | 8/2013 | Yoneda |
| 2013/0219164 | A1 | 8/2013 | Hamid |
| 2013/0227201 | A1 | 8/2013 | Talagala et al. |
| 2013/0290607 | A1 | 10/2013 | Chang et al. |
| 2013/0311434 | A1 | 11/2013 | Jones |
| 2013/0318297 | A1 | 11/2013 | Jibbe et al. |
| 2013/0332614 | A1 | 12/2013 | Brunk et al. |
| 2014/0020083 | A1 | 1/2014 | Fetik |
| 2014/0074850 | A1 | 3/2014 | Noel et al. |
| 2014/0082715 | A1 | 3/2014 | Grajek et al. |
| 2014/0086146 | A1 | 3/2014 | Kim et al. |
| 2014/0090009 | A1 | 3/2014 | Li et al. |
| 2014/0096220 | A1 | 4/2014 | Da Cruz Pinto et al. |
| 2014/0101434 | A1 | 4/2014 | Senthurpandi et al. |
| 2014/0164774 | A1 | 6/2014 | Nord et al. |
| 2014/0173232 | A1 | 6/2014 | Reohr et al. |
| 2014/0195636 | A1 | 7/2014 | Karve et al. |
| 2014/0201512 | A1 | 7/2014 | Seethaler et al. |
| 2014/0201541 | A1 | 7/2014 | Paul et al. |
| 2014/0208155 | A1 | 7/2014 | Pan |
| 2014/0215590 | A1 | 7/2014 | Brand |
| 2014/0229654 | A1 | 8/2014 | Goss et al. |
| 2014/0230017 | A1 | 8/2014 | Saib |
| 2014/0258526 | A1 | 9/2014 | Le Sant et al. |
| 2014/0282983 | A1 | 9/2014 | Ju et al. |
| 2014/0285917 | A1 | 9/2014 | Cudak et al. |
| 2014/0325262 | A1 | 10/2014 | Cooper et al. |
| 2014/0351627 | A1 | 11/2014 | Best et al. |
| 2014/0373104 | A1 | 12/2014 | Gaddam et al. |
| 2014/0373126 | A1 | 12/2014 | Hussain et al. |
| 2015/0026387 | A1 | 1/2015 | Sheredy et al. |
| 2015/0074463 | A1 | 3/2015 | Jacoby et al. |
| 2015/0089569 | A1 | 3/2015 | Sondhi et al. |
| 2015/0095515 | A1 | 4/2015 | Krithivas et al. |
| 2015/0113203 | A1 | 4/2015 | Dancho et al. |
| 2015/0121137 | A1 | 4/2015 | McKnight et al. |
| 2015/0134920 | A1 | 5/2015 | Anderson et al. |
| 2015/0149822 | A1 | 5/2015 | Coronado et al. |
| 2015/0193169 | A1 | 7/2015 | Sundaram et al. |
| 2015/0378888 | A1 | 12/2015 | Zhang et al. |
| 2016/0098323 | A1 | 4/2016 | Mutha et al. |
| 2016/0350009 | A1 | 12/2016 | Cerreta et al. |
| 2016/0352720 | A1 | 12/2016 | Hu et al. |
| 2016/0352830 | A1 | 12/2016 | Borowiec et al. |

(56) References Cited

U.S. PATENT DOCUMENTS

| | | |
|---|---|---|
| 2016/0352834 A1 | 12/2016 | Borowiec et al. |
| 2017/0031830 A1* | 2/2017 | Bk .................... G06F 3/0641 |

FOREIGN PATENT DOCUMENTS

| | | |
|---|---|---|
| WO | WO-2013071087 A1 | 5/2013 |
| WO | WO-2014/110137 A1 | 7/2014 |
| WO | WO-2016/015008 A1 | 12/2016 |
| WO | WO-2016/190938 A1 | 12/2016 |
| WO | WO-2016/195759 A1 | 12/2016 |
| WO | WO-2016/195958 A1 | 12/2016 |
| WO | WO-2016/195961 A1 | 12/2016 |

OTHER PUBLICATIONS

PCMAG, *Storage Array Definition*, Published May 10, 2013. <http://web.archive.org/web/20130510121646/http://www.pcmag.com/encyclopedia/term/52091/storage-array>, 2 pages.

Google Search of "storage array define" performed by the Examiner on Nov. 4, 2015 for U.S. Appl. No. 14/725,278, Results limited to entries dated before 2012, 1 page.

Techopedia, *What is a disk array*, techopedia.com (online), Jan. 13, 2012, 1 page, URL:web.archive.org/web/20120113053358/http://www.techopedia.com/definition/1009/disk-array.

Webopedia, *What is a disk array*, webopedia.com (online), May 26, 2011, 2 pages, URL:web/archive.org/web/20110526081214/http://www.webopedia.com/TERM/D/disk_array.html.

Li et al., *Access Control for the Services Oriented Architecture*, Proceedings of the 2007 ACM Workshop on Secure Web Services (SWS '07), Nov. 2007, pp. 9-17, ACM New York, NY.

Hota et al., *Capability-based Cryptographic Data Access Control in Cloud Computing*, International Journal of Advanced Networking and Applications, col. 1, Issue 1, Aug. 2011, 10 pages, Eswar Publications, India.

Faith, *dictzip file format*, GitHub.com (online), accessed Jul. 28, 2015, 1 page, URL: github.com/fidlej/idzip.

Wikipedia, *Convergent Encryption*, Wikipedia.org (online), accessed Sep. 8, 2015, 2 pages, URL: en.wikipedia.org/wiki/Convergent_encryption.

Storer et al., *Secure Data Deduplication*, Proceedings of the 4th ACM International Workshop on Storage Security and Survivability (StorageSS'08), Oct. 2008, 10 pages, ACM New York, NY. USA, DOI: 10.1145/1456469.1456471.

ETSI, *Network Function Virtualisation (NFV); Resiliency Requirements*, ETSI GS NFCV-REL 001, V1.1.1, Jan. 2015, 82 pages, etsi.org (online), URL: www.etsi.org/deliver/etsi_gs/NFV-REL/001_099/001/01.01.01_60/gs_NFV-REL001v010101p.pdf.

Microsoft, *Hybrid for SharePoint Server 2013—Security Reference Architecture*, Microsoft (online), Oct. 2014, 53 pages, URL: hybrid.office.com/img/Security_Reference_Architecture.pdf.

Microsoft, *Hybrid Identity*, Microsoft (online), Apr. 2014, 36 pages, URL: www.aka.ms/HybridIdentityWp.

Microsoft, *Hybrid Identity Management*, Microsoft (online), Apr. 2014, 17 pages URL: download.microsoft.com/download/E/A/E/EAE57CD1-A80B-423C-96BB-142FAAC630B9/Hybrid_Identity_Datasheet.pdf.

Bellamy-McIntyre et al., *OpenID and the Enterprise: A Model-based Analysis of Single Sign-On Authentication*, 15th IEEE International Enterprise Distributed Object Computing Conference (EDOC), Aug. 29, 2011, pp. 129-138, IEEE Computer Society, USA, DOI: 10.1109/EDOC.2011.26, ISBN: 978-1-4577-0362-1.

Kong, *Using PCI Express as The Primary System Interconnect In Multiroot Compute, Storage, Communications and Embedded Systems*, White Paper, IDT.com (online), Aug. 28, 2008, 12 pages, URL: www.idt.com/document/whp/idt-pcie-multi-root-white-paper.

Hu et al., *Container Marking: Combining Data Placement, Garbage Collection and Wear Levelling for Flash*, 19th Annual IEEE International Symposium on Modelling, Analysis, and Simulation of Computer and Telecommunications Systems, Jul. 25-27, 2011, 11 pages, ISBN: 978-0-7695-4430-4, DOI: 10.1109/MASCOTS.2011.50.

International Search Report and Written Opinion, PCT/US2016/015006, dated Jul. 18, 2016.

International Search Report and Written Opinion, PCT/US2016/015008, dated May 4, 2016.

International Search Report and Written Opinion, PCT/US2016/020410, dated Jul. 8, 2016.

International Search Report and Written Opinion, PCT/US2016/032084, dated Jul. 18, 2016.

International Search Report and Written Opinion, PCT/US2016/016333, dated Jun. 8, 2016.

International Search Report and Written Opinion, PCT/US2016/032052, dated Aug. 30, 2016.

International Search Report and Written Opinion, PCT/US2016/035492, dated Aug. 17, 2016.

International Search Report and Written Opinion, PCT/US2016/036693, dated Aug. 29, 2016.

International Search Report and Written Opinion, PCT/US2016/038758, dated Oct. 7, 2016.

International Search Report and Written Opinion, PCT/US2016/040393, dated Sep. 22, 2016.

International Search Report and Written Opinion, PCT/US2016/044020, dated Sep. 30, 2016.

International Search Report and Written Opinion, PCT/US2016/044874, dated Oct. 7, 2016.

International Search Report and Written Opinion, PCT/US2016/044875, dated Oct. 5, 2016.

International Search Report and Written Opinion, PCT/US2016/044876, dated Oct. 21, 2016.

International Search Report and Written Opinion, PCT/US2016/044877, dated Sep. 29, 2016.

\* cited by examiner

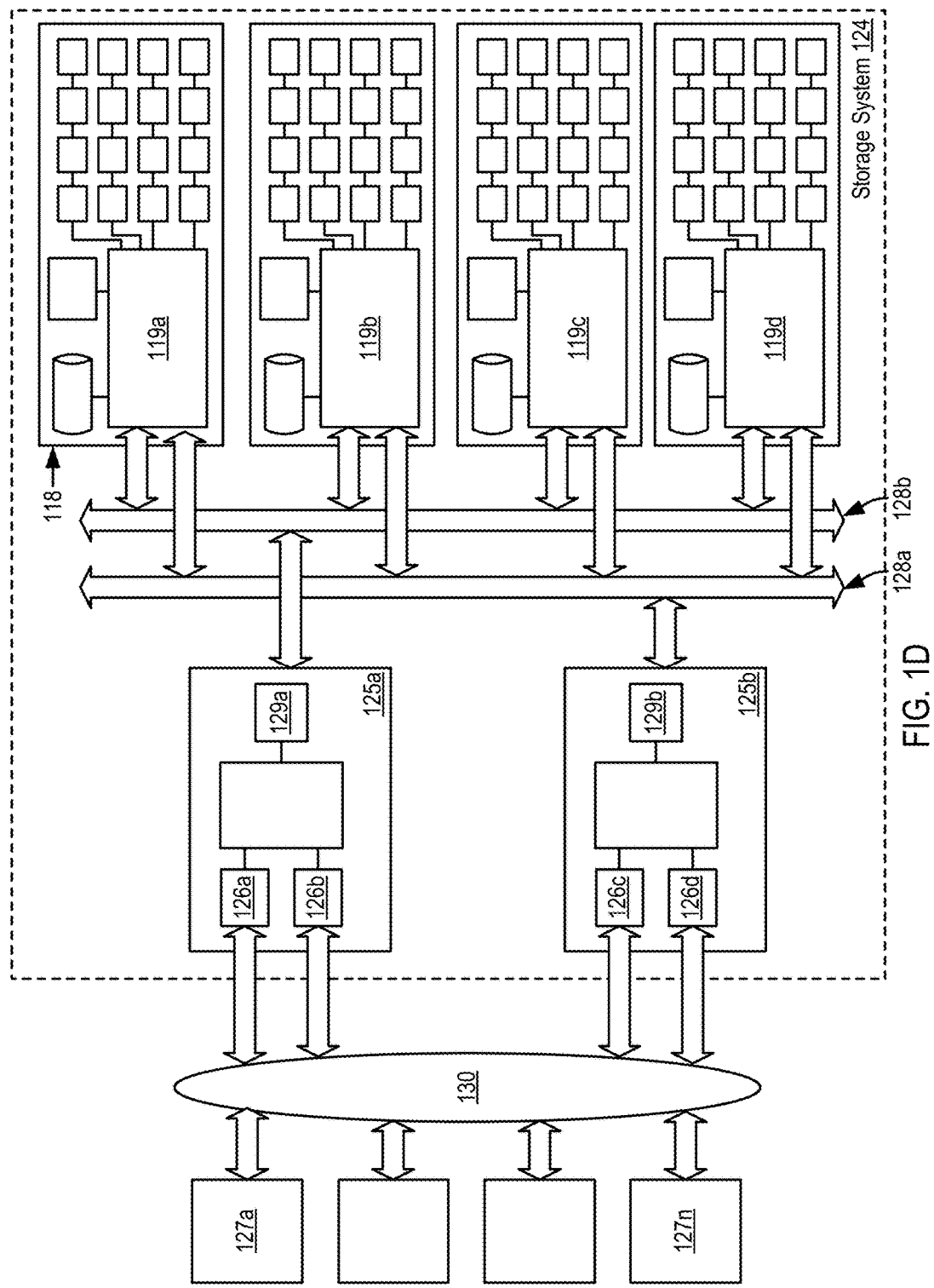

RESOLVING FINGERPRINT COLLISIONS IN FLASH STORAGE SYSTEM

CROSS-REFERENCE TO RELATED APPLICATIONS

This application is a non-provisional application for patent entitled to a filing date and claiming the benefit of earlier filed U.S. Provisional Patent Application Ser. No. 62/330,736, filed May 2, 2016, and U.S. Provisional Patent Application Ser. No. 62/468,348, filed Mar. 7, 2017.

BRIEF DESCRIPTION OF DRAWINGS

FIG. 1D illustrates a fourth example system for data storage in accordance with some implementations.

DESCRIPTION OF EMBODIMENTS

Figure 1A:
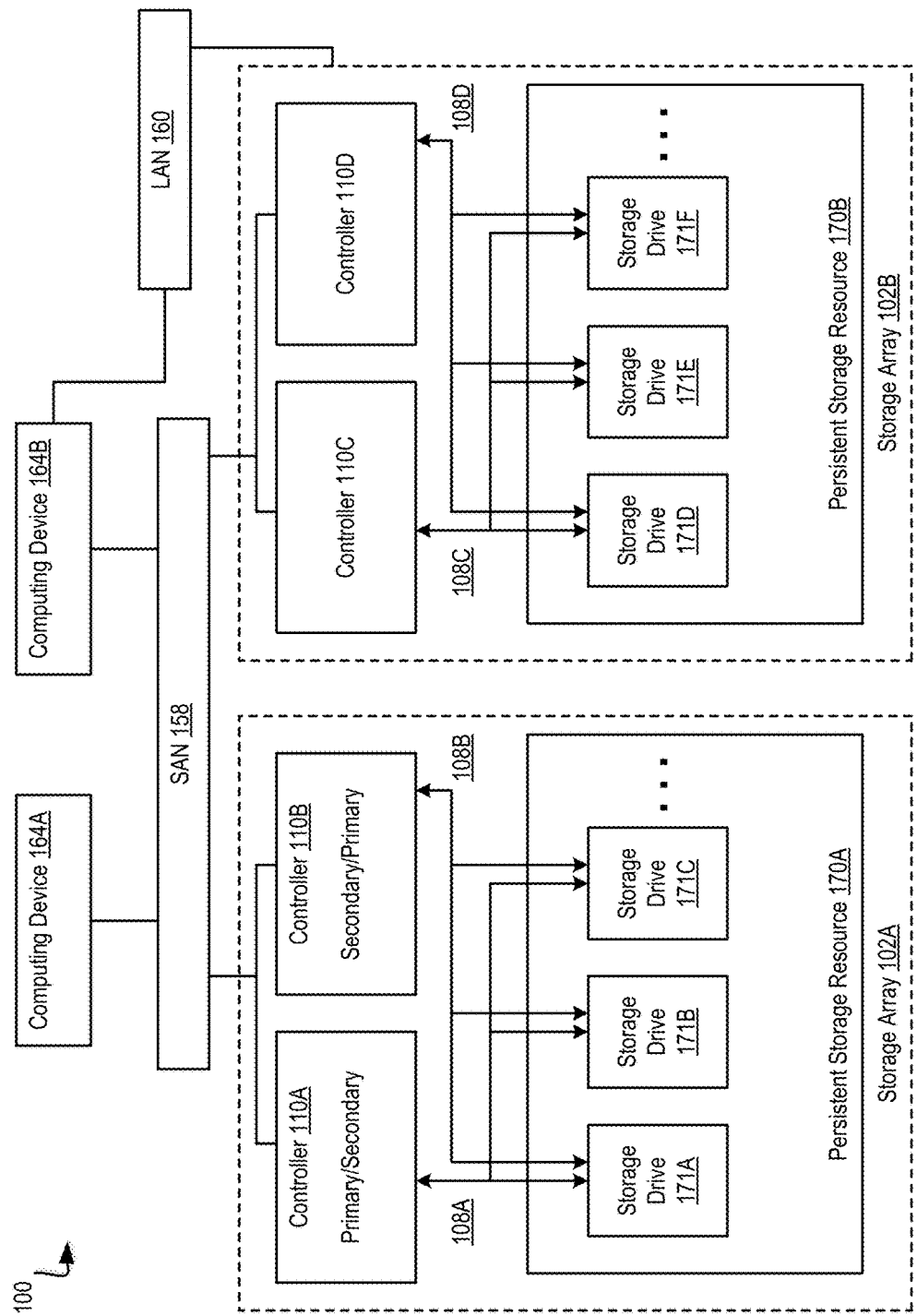
FIG. 1A illustrates a first example system for data storage in accordance with some implementations.

Example methods, apparatus, and products for handling fingerprint collisions in a storage system that includes one or more storage devices in accordance with embodiments of the present disclosure are described with reference to the accompanying drawings, beginning with FIG. 1A. FIG. 1A illustrates an example system for data storage, in accordance with some implementations. System 100 (also referred to as "storage system" herein) includes numerous elements for purposes of illustration rather than limitation. It may be noted that system 100 may include the same, more, or fewer elements configured in the same or different manner in other implementations.

System 100 includes a number of computing devices 164A-B. Computing devices (also referred to as "client devices" herein) may be embodied, for example, a server in a data center, a workstation, a personal computer, a notebook, or the like. Computing devices 164A-B may be coupled for data communications to one or more storage arrays 102A-B through a storage area network ('SAN') 158 or a local area network ('LAN') 160.

The SAN 158 may be implemented with a variety of data communications fabrics, devices, and protocols. For example, the fabrics for SAN 158 may include Fibre Channel, Ethernet, Infiniband, Serial Attached Small Computer System Interface ('SAS'), or the like. Data communications protocols for use with SAN 158 may include Advanced Technology Attachment ('ATA'), Fibre Channel Protocol, Small Computer System Interface ('SCSI'), Internet Small Computer System Interface ('iSCSI'), HyperSCSI, Non-Volatile Memory Express ('NVMe') over Fabrics, or the like. It may be noted that SAN 158 is provided for illustration, rather than limitation. Other data communication couplings may be implemented between computing devices 164A-B and storage arrays 102A-B.

The LAN 160 may also be implemented with a variety of fabrics, devices, and protocols. For example, the fabrics for LAN 160 may include Ethernet (802.3), wireless (802.11), or the like. Data communication protocols for use in LAN 160 may include Transmission Control Protocol ('TCP'), User Datagram Protocol ('UDP'), Internet Protocol (IF), HyperText Transfer Protocol ('HTTP'), Wireless Access Protocol ('WAP'), Handheld Device Transport Protocol ('HDTP'), Session Initiation Protocol ('SIP'), Real Time Protocol ('RTP'), or the like.

Storage arrays 102A-B may provide persistent data storage for the computing devices 164A-B. Storage array 102A may be contained in a chassis (not shown), and storage array 102B may be contained in another chassis (not shown), in implementations. Storage array 102A and 102B may include one or more storage array controllers 110 (also referred to as "controller" herein). A storage array controller 110 may be embodied as a module of automated computing machinery comprising computer hardware, computer software, or a combination of computer hardware and software. In some implementations, the storage array controllers 110 may be configured to carry out various storage tasks. Storage tasks may include writing data received from the computing devices 164A-B to storage array 102A-B, erasing data from storage array 102A-B, retrieving data from storage array 102A-B and providing data to computing devices 164A-B, monitoring and reporting of disk utilization and performance, performing redundancy operations, such as Redundant Array of Independent Drives ('RAID') or RAID-like data redundancy operations, compressing data, encrypting data, and so forth.

Storage array controller 110 may be implemented in a variety of ways, including as a Field Programmable Gate Array ('FPGA'), a Programmable Logic Chip ('PLC'), an Application Specific Integrated Circuit ('ASIC'), System-on-Chip ('SOC'), or any computing device that includes discrete components such as a processing device, central processing unit, computer memory, or various adapters. Storage array controller 110 may include, for example, a data communications adapter configured to support communications via the SAN 158 or LAN 160. In some implementations, storage array controller 110 may be independently coupled to the LAN 160. In implementations, storage array controller 110 may include an I/O controller or the like that couples the storage array controller 110 for data communications, through a midplane (not shown), to a persistent storage resource 170A-B (also referred to as a "storage resource" herein). The persistent storage resource 170A-B main include any number of storage drives 171A-F (also referred to as "storage devices" herein) and any number of non-volatile Random Access Memory ('NVRAM') devices (not shown).

In some implementations, the NVRAM devices of a persistent storage resource 170A-B may be configured to receive, from the storage array controller 110, data to be stored in the storage drives 171A-F. In some examples, the data may originate from computing devices 164A-B. In some examples, writing data to the NVRAM device may be carried out more quickly than directly writing data to the storage drive 171A-F. In implementations, the storage array controller 110 may be configured to utilize the NVRAM devices as a quickly accessible buffer for data destined to be written to the storage drives 171A-F. Latency for write requests using NVRAM devices as a buffer may be improved relative to a system in which a storage array controller 110 writes data directly to the storage drives 171A-F. In some implementations, the NVRAM devices may be implemented with computer memory in the form of high bandwidth, low latency RAM. The NVRAM device is referred to as "non-volatile" because the NVRAM device may receive or include a unique power source that maintains the state of the RAM after main power loss to the NVRAM device. Such a power source may be a battery, one or more capacitors, or the like. In response to a power loss, the NVRAM device may be configured to write the contents of the RAM to a persistent storage, such as the storage drives 171A-F.

In implementations, storage drive 171A-F may refer to any device configured to record data persistently, where "persistently" or "persistent" refers as to a device's ability to maintain recorded data after loss of power. In some implementations, storage drive 171A-F may correspond to non-disk storage media. For example, the storage drive 171A-F may be one or more solid-state drives ('SSDs'), flash memory based storage, any type of solid-state non-volatile memory, or any other type of non-mechanical storage device. In other implementations, storage drive 171A-F may include may include mechanical or spinning hard disk, such as hard-disk drives ('HDD').

In some implementations, the storage array controllers 110 may be configured for offloading device management responsibilities from storage drive 171A-F in storage array 102A-B. For example, storage array controllers 110 may manage control information that may describe the state of one or more memory blocks in the storage drives 171A-F. The control information may indicate, for example, that a particular memory block has failed and should no longer be written to, that a particular memory block contains boot code for a storage array controller 110, the number of program-erase ('P/E') cycles that have been performed on a particular memory block, the age of data stored in a particular memory block, the type of data that is stored in a particular memory block, and so forth. In some implementations, the control information may be stored with an associated memory block as metadata. In other implementations, the control information for the storage drives 171A-F may be stored in one or more particular memory blocks of the storage drives 171A-F that are selected by the storage array controller 110. The selected memory blocks may be tagged with an identifier indicating that the selected memory block contains control information. The identifier may be utilized by the storage array controllers 110 in conjunction with storage drives 171A-F to quickly identify the memory blocks that contain control information. For example, the storage controllers 110 may issue a command to locate memory blocks that contain control information. It may be noted that control information may be so large that parts of the control information may be stored in multiple locations, that the control information may be stored in multiple locations for purposes of redundancy, for example, or that the control information may otherwise be distributed across multiple memory blocks in the storage drive 171A-F.

In implementations, storage array controllers 110 may offload device management responsibilities from storage drives 171A-F of storage array 102A-B by retrieving, from the storage drives 171A-F, control information describing the state of one or more memory blocks in the storage drives 171A-F. Retrieving the control information from the storage drives 171A-F may be carried out, for example, by the storage array controller 110 querying the storage drives 171A-F for the location of control information for a particular storage drive 171A-F. The storage drives 171A-F may be configured to execute instructions that enable the storage drive 171A-F to identify the location of the control information. The instructions may be executed by a controller (not shown) associated with or otherwise located on the storage drive 171A-F and may cause the storage drive 171A-F to scan a portion of each memory block to identify the memory blocks that store control information for the storage drives 171A-F. The storage drives 171A-F may respond by sending a response message to the storage array controller 110 that includes the location of control information for the storage drive 171A-F. Responsive to receiving the response message, storage array controllers 110 may issue a request to read data stored at the address associated with the location of control information for the storage drives 171A-F.

In other implementations, the storage array controllers 110 may further offload device management responsibilities from storage drives 171A-F by performing, in response to receiving the control information, a storage drive management operation. A storage drive management operation may include, for example, an operation that is typically performed by the storage drive 171A-F (e.g., the controller (not shown) associated with a particular storage drive 171A-F). A storage drive management operation may include, for example, ensuring that data is not written to failed memory blocks within the storage drive 171A-F, ensuring that data is written to memory blocks within the storage drive 171A-F in such a way that adequate wear leveling is achieved, and so forth.

In implementations, storage array 102A-B may implement two or more storage array controllers 110. For example, storage array 102A may include storage array controllers 110A and storage array controllers 110B. At a given instance, a single storage array controller 110 (e.g., storage array controller 110A) of a storage system 100 may be designated with primary status (also referred to as "primary controller" herein), and other storage array controllers 110 (e.g., storage array controller 110A) may be designated with secondary status (also referred to as "secondary controller" herein). The primary controller may have particular rights, such as permission to alter data in persistent storage resource 170A-B (e.g., writing data to persistent storage resource 170A-B). At least some of the rights of the primary controller may supersede the rights of the secondary controller. For instance, the secondary controller may not have permission to alter data in persistent storage resource 170A-B when the primary controller has the right. The status of storage array controllers 110 may change. For example, storage array controller 110A may be designated with secondary status, and storage array controller 110B may be designated with primary status.

In some implementations, a primary controller, such as storage array controller 110A, may serve as the primary controller for one or more storage arrays 102A-B, and a second controller, such as storage array controller 110B, may serve as the secondary controller for the one or more storage arrays 102A-B. For example, storage array controller 110A may be the primary controller for storage array 102A and storage array 102B, and storage array controller 110B may be the secondary controller for storage array 102A and 102B. In some implementations, storage array controllers 110C and 110D (also referred to as "storage processing modules") may neither have primary or secondary status. Storage array controllers 110C and 110D, implemented as storage processing modules, may act as a communication interface between the primary and secondary controllers (e.g., storage array controllers 110A and 110B, respectively) and storage array 102B. For example, storage array controller 110A of storage array 102A may send a write request, via SAN 158, to storage array 102B. The write request may be received by both storage array controllers 110C and 110D of storage array 102B. Storage array controllers 110C and 110D facilitate the communication, e.g., send the write request to the appropriate storage drive 171A-F. It may be noted that in some implementations storage processing modules may be used to increase the number of storage drives controlled by the primary and secondary controllers.

In implementations, storage array controllers 110 are communicatively coupled, via a midplane (not shown), to one or more storage drives 171A-F and to one or more NVRAM devices (not shown) that are included as part of a storage array 102A-B. The storage array controllers 110 may be coupled to the midplane via one or more data communication links and the midplane may be coupled to the storage drives 171A-F and the NVRAM devices via one or more data communications links. The data communications links described herein are collectively illustrated by data communications links 108A-D and may include a Peripheral Component Interconnect Express ('PCIe') bus, for example.

Figure 1B:
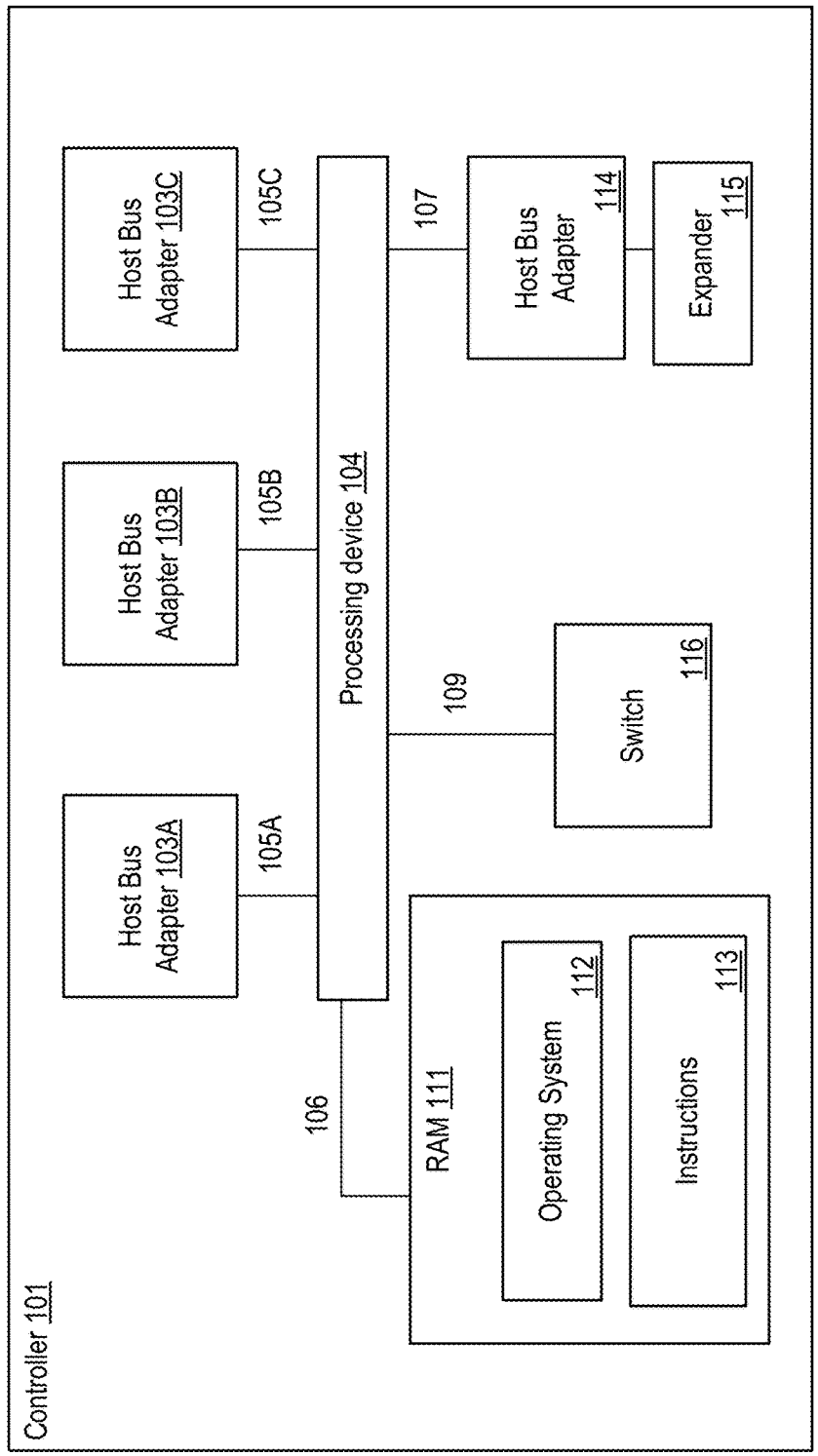
FIG. 1B illustrates a second example system for data storage in accordance with some implementations.

FIG. 1B illustrates an example system for data storage, in accordance with some implementations. Storage array controller 101 illustrated in FIG. 1B may similar to the storage array controllers 110 described with respect to FIG. 1A. In one example, storage array controller 101 may be similar to storage array controller 110A or storage array controller 110B. Storage array controller 101 includes numerous elements for purposes of illustration rather than limitation. It may be noted that storage array controller 101 may include the same, more, or fewer elements configured in the same or different manner in other implementations. It may be noted that elements of FIG. 1A may be included below to help illustrate features of storage array controller 101.

Storage array controller 101 may include one or more processing devices 104 and random access memory ('RAM') 111. Processing device 104 (or controller 101) represents one or more general-purpose processing devices such as a microprocessor, central processing unit, or the like. More particularly, the processing device 104 (or controller 101) may be a complex instruction set computing ('CISC') microprocessor, reduced instruction set computing ('RISC') microprocessor, very long instruction word ('VLIW') microprocessor, or a processor implementing other instruction sets or processors implementing a combination of instruction sets. The processing device 104 (or controller 101) may also be one or more special-purpose processing devices such as an application specific integrated circuit ('ASIC'), a field programmable gate array ('FPGA'), a digital signal processor ('DSP'), network processor, or the like.

The processing device 104 may be connected to the RAM 111 via a data communications link 106, which may be embodied as a high speed memory bus such as a Double-Data Rate 4 ('DDR4') bus. Stored in RAM 111 is an operating system 112. In some implementations, instructions 113 are stored in RAM 111. Instructions 113 may include computer program instructions for performing operations in in a direct-mapped flash storage system. In one embodiment, a direct-mapped flash storage system is one that that addresses data blocks within flash drives directly and without an address translation performed by the storage controllers of the flash drives.

In implementations, storage array controller 101 includes one or more host bus adapters 103A-C that are coupled to the processing device 104 via a data communications link 105A-C. In implementations, host bus adapters 103A-C may be computer hardware that connects a host system (e.g., the storage array controller) to other network and storage arrays. In some examples, host bus adapters 103A-C may be a Fibre Channel adapter that enables the storage array controller 101 to connect to a SAN, an Ethernet adapter that enables the storage array controller 101 to connect to a LAN, or the like. Host bus adapters 103A-C may be coupled to the processing device 104 via a data communications link 105A-C such as, for example, a PCIe bus.

In implementations, storage array controller 101 may include a host bus adapter 114 that is coupled to an expander 115. The expander 115 may be used to attach a host system to a larger number of storage drives. The expander 115 may, for example, be a SAS expander utilized to enable the host bus adapter 114 to attach to storage drives in an implementation where the host bus adapter 114 is embodied as a SAS controller.

In implementations, storage array controller 101 may include a switch 116 coupled to the processing device 104 via a data communications link 109. The switch 116 may be a computer hardware device that can create multiple endpoints out of a single endpoint, thereby enabling multiple devices to share a single endpoint. The switch 116 may, for example, be a PCIe switch that is coupled to a PCIe bus (e.g., data communications link 109) and presents multiple PCIe connection points to the midplane.

In implementations, storage array controller 101 includes a data communications link 107 for coupling the storage array controller 101 to other storage array controllers. In some examples, data communications link 107 may be a QuickPath Interconnect (QPI) interconnect.

A traditional storage system that uses traditional flash drives may implement a process across the flash drives that are part of the traditional storage system. For example, a higher level process of the storage system may initiate and control a process across the flash drives. However, a flash drive of the traditional storage system may include its own storage controller that also performs the process. Thus, for the traditional storage system, a higher level process (e.g., initiated by the storage system) and a lower level process (e.g., initiated by a storage controller of the storage system) may both be performed.

To resolve various deficiencies of a traditional storage system, operations may be performed by higher level processes and not by the lower level processes. For example, the flash storage system may include flash drives that do not include storage controllers that provide the process. Thus, the operating system of the flash storage system itself may initiate and control the process. This may be accomplished by a direct-mapped flash storage system that addresses data blocks within the flash drives directly and without an address translation performed by the storage controllers of the flash drives.

The operating system of the flash storage system may identify and maintain a list of allocation units across multiple flash drives of the flash storage system. The allocation units may be entire erase blocks or multiple erase blocks. The operating system may maintain a map or address range that directly maps addresses to erase blocks of the flash drives of the flash storage system.

Direct mapping to the erase blocks of the flash drives may be used to rewrite data and erase data. For example, the operations may be performed on one or more allocation units that include a first data and a second data where the first data is to be retained and the second data is no longer being used by the flash storage system. The operating system may initiate the process to write the first data to new locations within other allocation units and erasing the second data and marking the allocation units as being available for use for subsequent data. Thus, the process may only be performed by the higher level operating system of the flash storage system without an additional lower level process being performed by controllers of the flash drives.

Advantages of the process being performed only by the operating system of the flash storage system include increased reliability of the flash drives of the flash storage system as unnecessary or redundant write operations are not being performed during the process. One possible point of novelty here is the concept of initiating and controlling the process at the operating system of the flash storage system. In addition, the process can be controlled by the operating system across multiple flash drives. This is contrast to the process being performed by a storage controller of a flash drive.

A storage system can consist of two storage array controllers that share a set of drives for failover purposes, or it could consist of a single storage array controller that provides a storage service that utilizes multiple drives, or it could consist of a distributed network of storage array controllers each with some number of drives or some amount of Flash storage where the storage array controllers in the network collaborate to provide a complete storage service and collaborate on various aspects of a storage service including storage allocation and garbage collection.

Figure 1C:
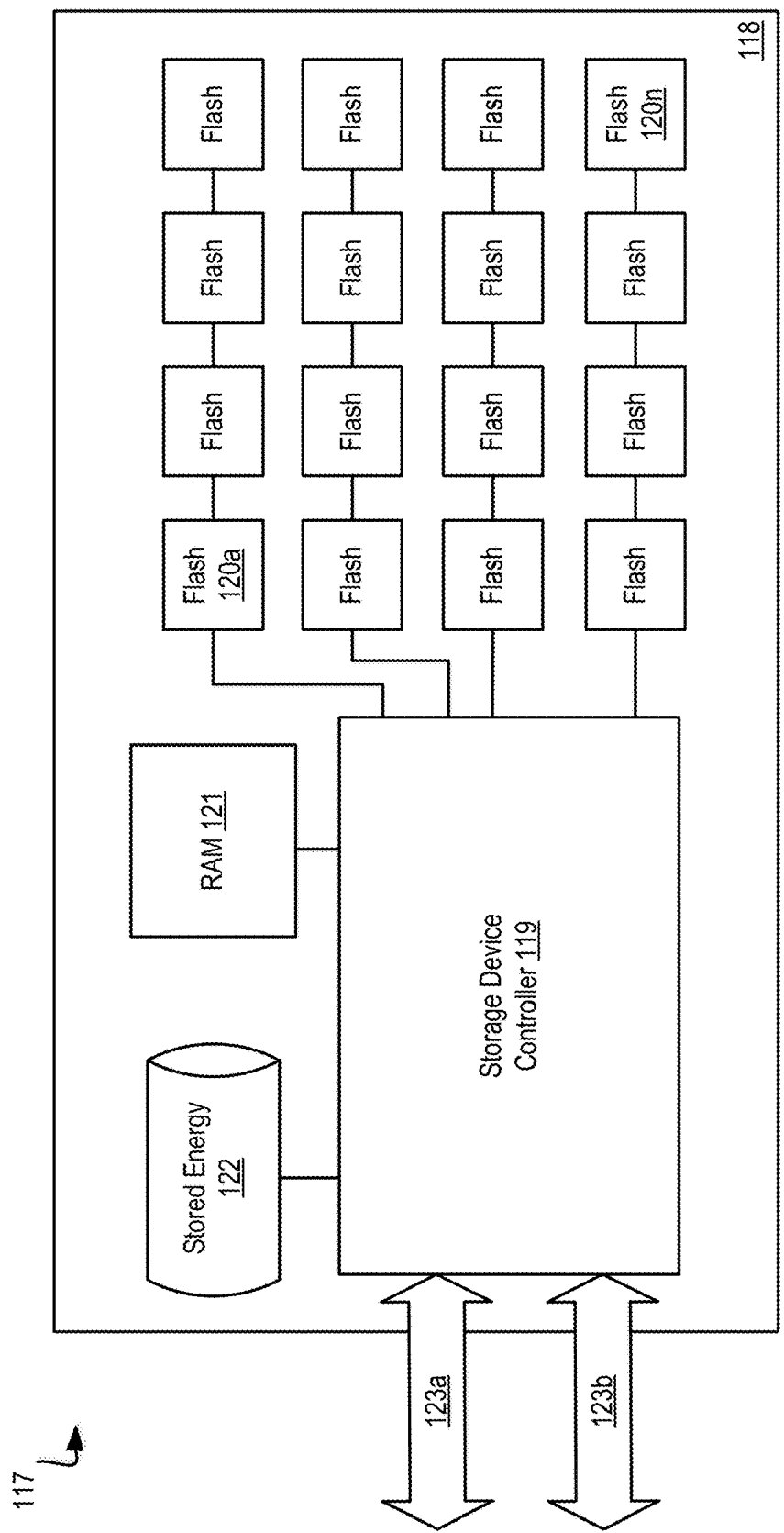
FIG. 1C illustrates a third example system for data storage in accordance with some implementations.

FIG. 1C illustrates a third example system 117 for data storage in accordance with some implementations. System 117 (also referred to as "storage system" herein) includes numerous elements for purposes of illustration rather than limitation. It may be noted that system 117 may include the same, more, or fewer elements configured in the same or different manner in other implementations.

In one embodiment, system 117 includes a dual Peripheral Component Interconnect ('PCI') flash storage device 118 with separately addressable fast write storage. System 117 may include a storage controller 119. In one embodiment, storage controller 119 may be a CPU, ASIC, FPGA, or any other circuitry that may implement control structures necessary according to the present disclosure. In one embodiment, system 117 includes flash memory devices (e.g., including flash memory devices 120a-n), operatively coupled to various channels of the storage device controller 119. Flash memory devices 120a-n, may be presented to the controller 119 as an addressable collection of Flash pages, erase blocks, and/or control elements sufficient to allow the storage device controller 119 to program and retrieve various aspects of the Flash. In one embodiment, storage device controller 119 may perform operations on flash memory devices 120A-N including storing and retrieving data content of pages, arranging and erasing any blocks, tracking statistics related to the use and reuse of Flash memory pages, erase blocks, and cells, tracking and predicting error codes and faults within the Flash memory, controlling voltage levels associated with programming and retrieving contents of Flash cells, etc.

In one embodiment, system 117 may include RAM 121 to store separately addressable fast-write data. In one embodiment, RAM 121 may be one or more separate discrete devices. In another embodiment, RAM 121 may be integrated into storage device controller 119 or multiple storage device controllers. The RAM 121 may be utilized for other purposes as well, such as temporary program memory for a processing device (e.g., a CPU) in the storage device controller 119.

In one embodiment, system 119 may include a stored energy device 122, such as a rechargeable battery or a capacitor. Stored energy device 122 may store energy sufficient to power the storage device controller 119, some amount of the RAM (e.g., RAM 121), and some amount of Flash memory (e.g., Flash memory 120a-120n) for sufficient time to write the contents of RAM to Flash memory. In one embodiment, storage device controller 119 may write the contents of RAM to Flash Memory if the storage device controller detects loss of external power.

In one embodiment, system 117 includes two data communications links 123a, 123b. In one embodiment, data communications links 123a, 123b may be PCI interfaces. In another embodiment, data communications links 123a, 123b may be based on other communications standards (e.g., HyperTransport, InfiniBand, etc.). Data communications links 123a, 123b may be based on non-volatile memory express ('NVMe') or NVMe over fabrics ('NVMf') specifications that allow external connection to the storage device controller 119 from other components in the storage system 117. It should be noted that data communications links may be interchangeably referred to herein as PCI buses for convenience.

System 117 may also include an external power source (not shown), which may be provided over one or both data communications links 123a, 123b, or which may be provided separately. An alternative embodiment includes a separate Flash memory (not shown) dedicated for use in storing the content of RAM 121. The storage device controller 119 may present a logical device over a PCI bus which may include an addressable fast-write logical device, or a distinct part of the logical address space of the storage device 118, which may be presented as PCI memory or as persistent storage. In one embodiment, operations to store into the device are directed into the RAM 121. On power failure, the storage device controller 119 may write stored content associated with the addressable fast-write logical storage to Flash memory (e.g., Flash memory 120a-n) for long-term persistent storage.

In one embodiment, the logical device may include some presentation of some or all of the content of the Flash memory devices 120a-n, where that presentation allows a storage system including a storage device 118 (e.g., storage system 117) to directly address Flash memory pages and directly reprogram erase blocks from storage system components that are external to the storage device through the PCI bus. The presentation may also allow one or more of the external components to control and retrieve other aspects of the Flash memory including some or all of: tracking statistics related to use and reuse of Flash memory pages, erase blocks, and cells across all the Flash memory devices; tracking and predicting error codes and faults within and across the Flash memory devices; controlling voltage levels associated with programming and retrieving contents of Flash cells; etc.

In one embodiment, the stored energy device 122 may be sufficient to ensure completion of in-progress operations to the Flash memory devices 107a-120n stored energy device 122 may power storage device controller 119 and associated Flash memory devices (e.g., 120a-n) for those operations, as well as for the storing of fast-write RAM to Flash memory. Stored energy device 122 may be used to store accumulated statistics and other parameters kept and tracked by the Flash memory devices 120a-n and/or the storage device controller 119. Separate capacitors or stored energy devices (such as smaller capacitors near or embedded within the Flash memory devices themselves) may be used for some or all of the operations described herein.

Various schemes may be used to track and optimize the life span of the stored energy component, such as adjusting voltage levels over time, partially discharging the storage energy device 122 to measure corresponding discharge characteristics, etc. If the available energy decreases over time, the effective available capacity of the addressable fast-write storage may be decreased to ensure that it can be written safely based on the currently available stored energy.

FIG. 1D illustrates a third example system 124 for data storage in accordance with some implementations. In one embodiment, system 124 includes storage controllers 125a, 125b. In one embodiment, storage controllers 125a, 125b are operatively coupled to Dual PCI storage devices 119a, 119b and 119c, 119d, respectively. Storage controllers 125a, 125b may be operatively coupled (e.g., via a storage network 130) to some number of host computers 127a-n.

In one embodiment, two storage controllers (e.g., 125a and 125b) provide storage services, such as a SCS) block storage array, a file server, an object server, a database or data analytics service, etc. The storage controllers 125a, 125b may provide services through some number of network interfaces (e.g., 126a-d) to host computers 127a-n outside of the storage system 124. Storage controllers 125a, 125b may provide integrated services or an application entirely within the storage system 124, forming a converged storage and compute system. The storage controllers 125a, 125b may utilize the fast write memory within or across storage devices 119a-d to journal in progress operations to ensure the operations are not lost on a power failure, storage controller removal, storage controller or storage system shutdown, or some fault of one or more software or hardware components within the storage system 124.

In one embodiment, controllers 125a, 125b operate as PCI masters to one or the other PCI buses 128a, 128b. In another embodiment, 128a and 128b may be based on other communications standards (e.g., HyperTransport, InfiniBand, etc.). Other storage system embodiments may operate storage controllers 125a, 125b as multi-masters for both PCI buses 128a, 128b. Alternately, a PCI/NVMe/NVMf switching infrastructure or fabric may connect multiple storage controllers. Some storage system embodiments may allow storage devices to communicate with each other directly rather than communicating only with storage controllers. In one embodiment, a storage device controller 119a may be operable under direction from a storage controller 125a to synthesize and transfer data to be stored into Flash memory devices from data that has been stored in RAM (e.g., RAM 121 of FIG. 1C). For example, a recalculated version of RAM content may be transferred after a storage controller has determined that an operation has fully committed across the storage system, or when fast-write memory on the device has reached a certain used capacity, or after a certain amount of time, to ensure improve safety of the data or to release addressable fast-write capacity for reuse. This mechanism may be used, for example, to avoid a second transfer over a bus (e.g., 128a, 128b) from the storage controllers 125a, 125b. In one embodiment, a recalculation may include compressing data, attaching indexing or other metadata, combining multiple data segments together, performing erasure code calculations, etc.

In one embodiment, under direction from a storage controller 125a, 125b, a storage device controller 119a, 119b may be operable to calculate and transfer data to other storage devices from data stored in RAM (e.g., RAM 121 of FIG. 1C) without involvement of the storage controllers 125a, 125b. This operation may be used to mirror data stored in one controller 125a to another controller 125b, or it could be used to offload compression, data aggregation, and/or erasure coding calculations and transfers to storage devices to reduce load on storage controllers or the storage controller interface 129a, 129b to the PCI bus 128a, 128b.

A storage device controller 119 may include mechanisms for implementing high availability primitives for use by other parts of a storage system external to the Dual PCI storage device 118. For example, reservation or exclusion primitives may be provided so that, in a storage system with two storage controllers providing a highly available storage service, one storage controller may prevent the other storage controller from accessing or continuing to access the storage device. This could be used, for example, in cases where one controller detects that the other controller is not functioning properly or where the interconnect between the two storage controllers may itself not be functioning properly.

In one embodiment, a storage system for use with Dual PCI direct mapped storage devices with separately addressable fast write storage includes systems that manage erase blocks or groups of erase blocks as allocation units for storing data on behalf of the storage service, or for storing metadata (e.g., indexes, logs, etc.) associated with the storage service, or for proper management of the storage system itself. Flash pages, which may be a few kilobytes in size, may be written as data arrives or as the storage system is to persist data for long intervals of time (e.g., above a defined threshold of time). To commit data more quickly, or to reduce the number of writes to the Flash memory devices, the storage controllers may first write data into the separately addressable fast write storage on one more storage devices.

In one embodiment, the storage controllers 125a, 125b may initiate the use of erase blocks within and across storage devices (e.g., 118) in accordance with an age and expected remaining lifespan of the storage devices, or based on other statistics. The storage controllers 125a, 125b may initiate garbage collection and data migration data between storage devices in accordance with pages that are no longer needed as well as to manage Flash page and erase block lifespans and to manage overall system performance.

In one embodiment, the storage system 124 may utilize mirroring and/or erasure coding schemes as part of storing data into addressable fast write storage and/or as part of writing data into allocation units associated with erase blocks. Erasure codes may be used across storage devices, as well as within erase blocks or allocation units, or within and across Flash memory devices on a single storage device, to provide redundancy against single or multiple storage device failures or to protect against internal corruptions of Flash memory pages resulting from Flash memory operations or from degradation of Flash memory cells. Mirroring and erasure coding at various levels may be used to recover from multiple types of failures that occur separately or in combination.

The embodiments depicted with reference to FIGS. 2A-G illustrate a storage cluster that stores user data, such as user data originating from one or more user or client systems or other sources external to the storage cluster. The storage cluster distributes user data across storage nodes housed within a chassis, or across multiple chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster may be contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as PCIe, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system ('NFS'), common internet file system ('CIFS'), small computer system interface ('SCSI') or hypertext transfer protocol ('HTTP'). Translation from the client protocol may occur at the switch, chassis external communication bus or within each storage node. In some embodiments, multiple chassis may be coupled or connected to each other through an aggregator switch. A portion and/or all of the coupled or connected chassis may be designated as a storage cluster. As discussed above, each chassis can have multiple blades, each blade has a media access control ('MAC') address, but the storage cluster is presented to an external network as having a single cluster IP address and a single MAC address in some embodiments.

Each storage node may be one or more storage servers and each storage server is connected to one or more non-volatile solid state memory units, which may be referred to as storage units or storage devices. One embodiment includes a single storage server in each storage node and between one to eight non-volatile solid state memory units, however this one example is not meant to be limiting. The storage server may include a processor, DRAM and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded CPU, solid state storage controller, and a quantity of solid state mass storage, e.g., between 2-32 terabytes ('TB') in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory ('MRAM') that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

Figure 2A:
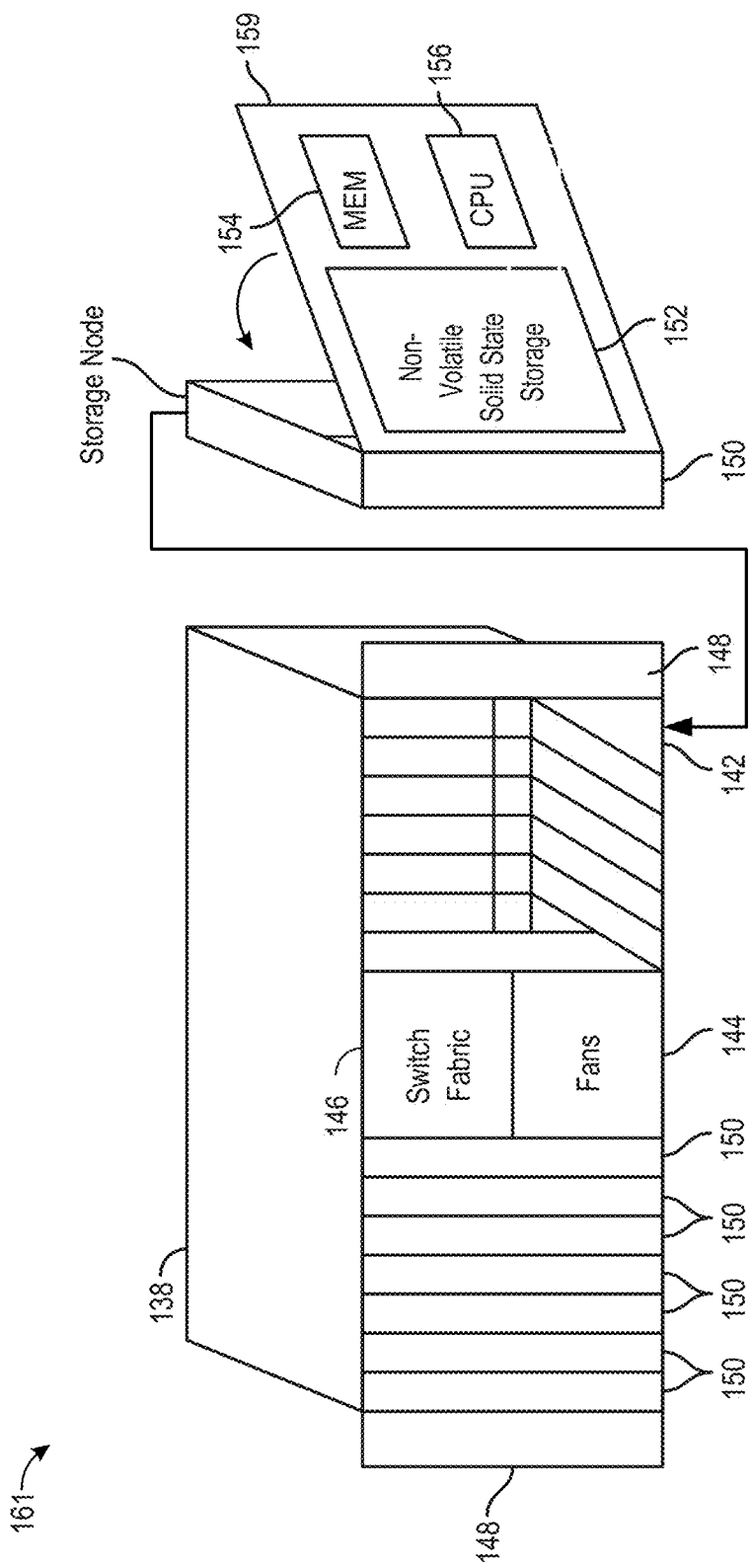
FIG. 2A is a perspective view of a storage cluster with multiple storage nodes and internal storage coupled to each storage node to provide network attached storage, in accordance with some embodiments.

FIG. 2A is a perspective view of a storage cluster 161, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 161, each having one or more storage nodes 150, in a flexible and reconfigurable arrangement of both the physical components and the amount of storage memory provided thereby. The storage cluster 161 is designed to fit in a rack, and one or more racks can be set up and populated as desired for the storage memory. The storage cluster 161 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in herein, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 159 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Referring to FIG. 2A, storage cluster 161 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 2B:
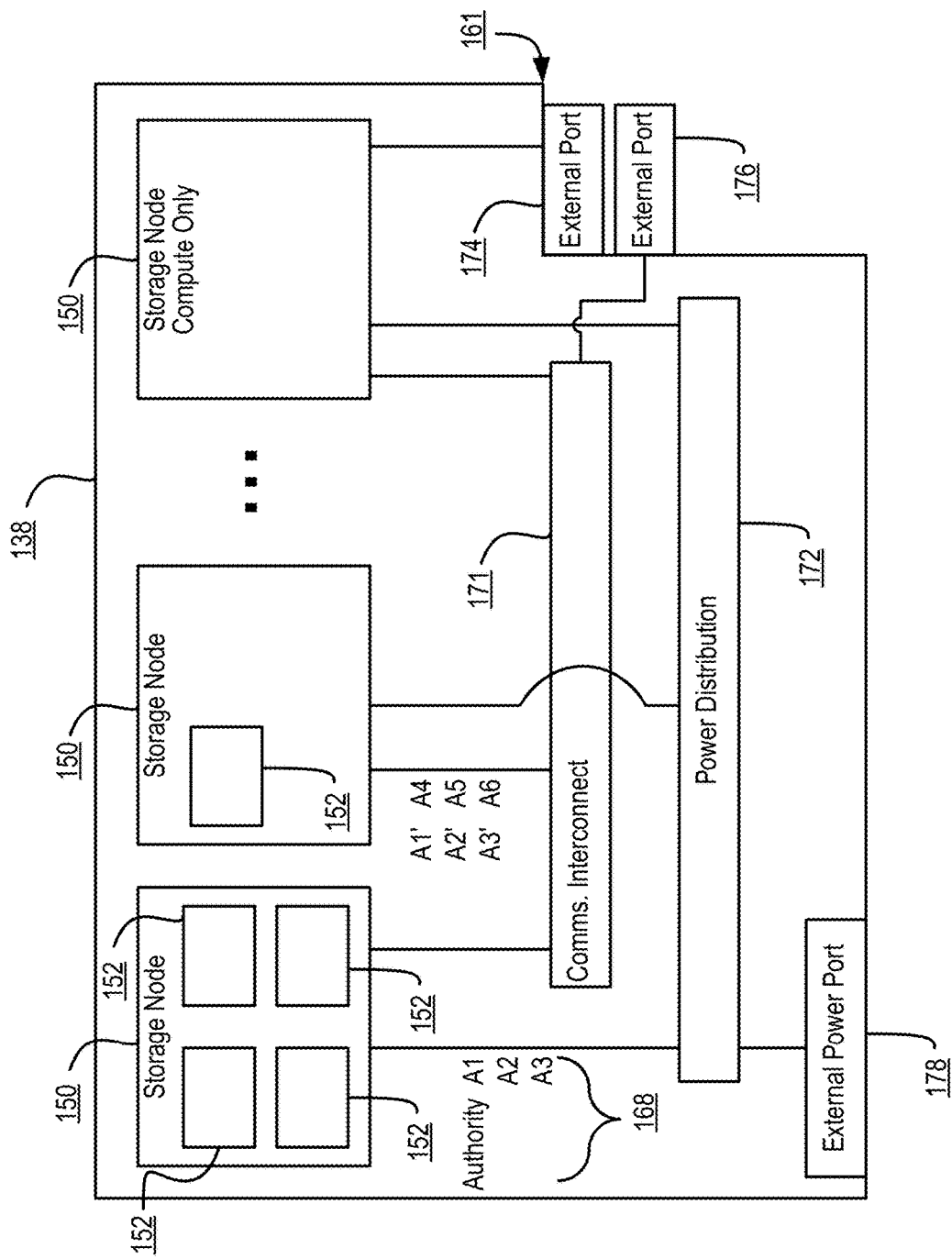
FIG. 2B is a block diagram showing an interconnect switch coupling multiple storage nodes in accordance with some embodiments.

FIG. 2B is a block diagram showing a communications interconnect 171 and power distribution bus 172 coupling multiple storage nodes 150. Referring back to FIG. 2A, the communications interconnect 171 can be included in or implemented with the switch fabric 146 in some embodiments. Where multiple storage clusters 161 occupy a rack, the communications interconnect 171 can be included in or implemented with a top of rack switch, in some embodiments. As illustrated in FIG. 2B, storage cluster 161 is enclosed within a single chassis 138. External port 176 is coupled to storage nodes 150 through communications interconnect 171, while external port 174 is coupled directly to a storage node. External power port 178 is coupled to power distribution bus 172. Storage nodes 150 may include varying amounts and differing capacities of non-volatile solid state storage 152 as described with reference to FIG. 2A. In addition, one or more storage nodes 150 may be a compute only storage node as illustrated in FIG. 2B. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of inode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an inode number or a data segment number. The output of this operation points to a non-volatile solid state storage 152 having the authority 168 for that particular piece of data. In some embodiments there are two stages to this operation. The first stage maps an entity identifier (ID), e.g., a segment number, inode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 2A and 2B, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain meta-data, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIGS. 2E and 2G) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top are the directory entries (file names) which link to an inode. Inodes point into medium address space, where data is logically stored. Medium addresses may be mapped through a series of indirect mediums to spread the load of large files, or implement data services like deduplication or snapshots. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage unit 152 may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check ('LDPC') code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudo randomly assigning entities to authorities, by splitting entities into ranges based upon an externally produced key, or by placing a single entity into each authority. Examples of pseudorandom schemes are linear hashing and the Replication Under Scalable Hashing ('RUSH') family of hashes, including Controlled Replication Under Scalable Hashing ('CRUSH'). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being transmitted. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing, i.e., the system supports non-disruptive upgrades.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 2C:
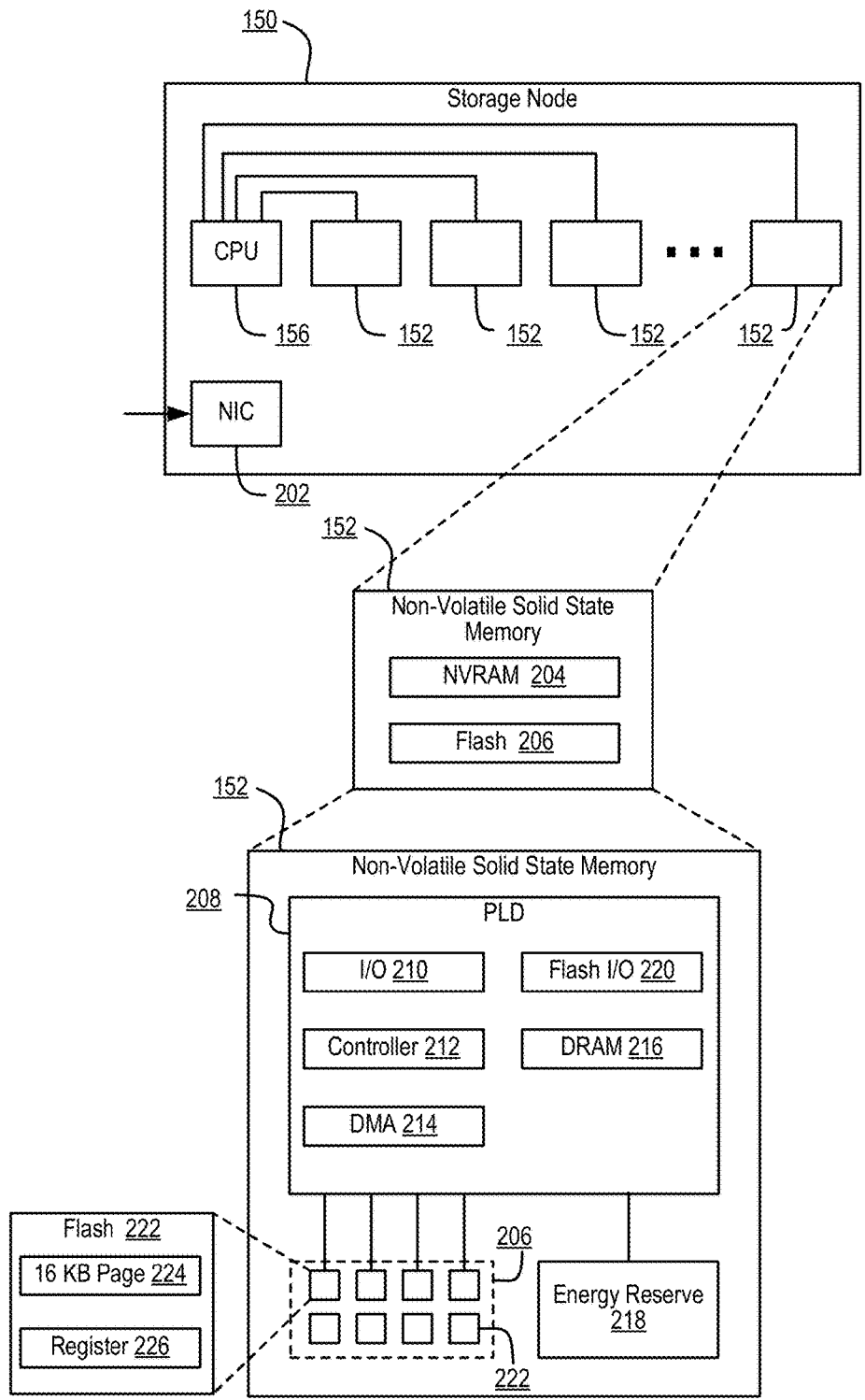
FIG. 2C is a multiple level block diagram, showing contents of a storage node and contents of one of the non-volatile solid state storage units in accordance with some embodiments.

FIG. 2C is a multiple level block diagram, showing contents of a storage node 150 and contents of a non-volatile solid state storage 152 of the storage node 150. Data is communicated to and from the storage node 150 by a network interface controller ('NIC') 202 in some embodiments. Each storage node 150 has a CPU 156, and one or more non-volatile solid state storage 152, as discussed above. Moving down one level in FIG. 2C, each non-volatile solid state storage 152 has a relatively fast non-volatile solid state memory, such as nonvolatile random access memory ('NVRAM') 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 2C, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device ('PLD') 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Storage clusters 161, in various embodiments as disclosed herein, can be contrasted with storage arrays in general. The storage nodes 150 are part of a collection that creates the storage cluster 161. Each storage node 150 owns a slice of data and computing required to provide the data. Multiple storage nodes 150 cooperate to store and retrieve the data. Storage memory or storage devices, as used in storage arrays in general, are less involved with processing and manipulating the data. Storage memory or storage devices in a storage array receive commands to read, write, or erase data. The storage memory or storage devices in a storage array are not aware of a larger system in which they are embedded, or what the data means. Storage memory or storage devices in storage arrays can include various types of storage memory, such as RAM, solid state drives, hard disk drives, etc. The storage units 152 described herein have multiple interfaces active simultaneously and serving multiple purposes. In some embodiments, some of the functionality of a storage node 150 is shifted into a storage unit 152, transforming the storage unit 152 into a combination of storage unit 152 and storage node 150. Placing computing (relative to storage data) into the storage unit 152 places this computing closer to the data itself. The various system embodiments have a hierarchy of storage node layers with different capabilities. By contrast, in a storage array, a controller owns and knows everything about all of the data that the controller manages in a shelf or storage devices. In a storage cluster 161, as described herein, multiple controllers in multiple storage units 152 and/or storage nodes 150 cooperate in various ways (e.g., for erasure coding, data sharding, metadata communication and redundancy, storage capacity expansion or contraction, data recovery, and so on).

Figure 2D:
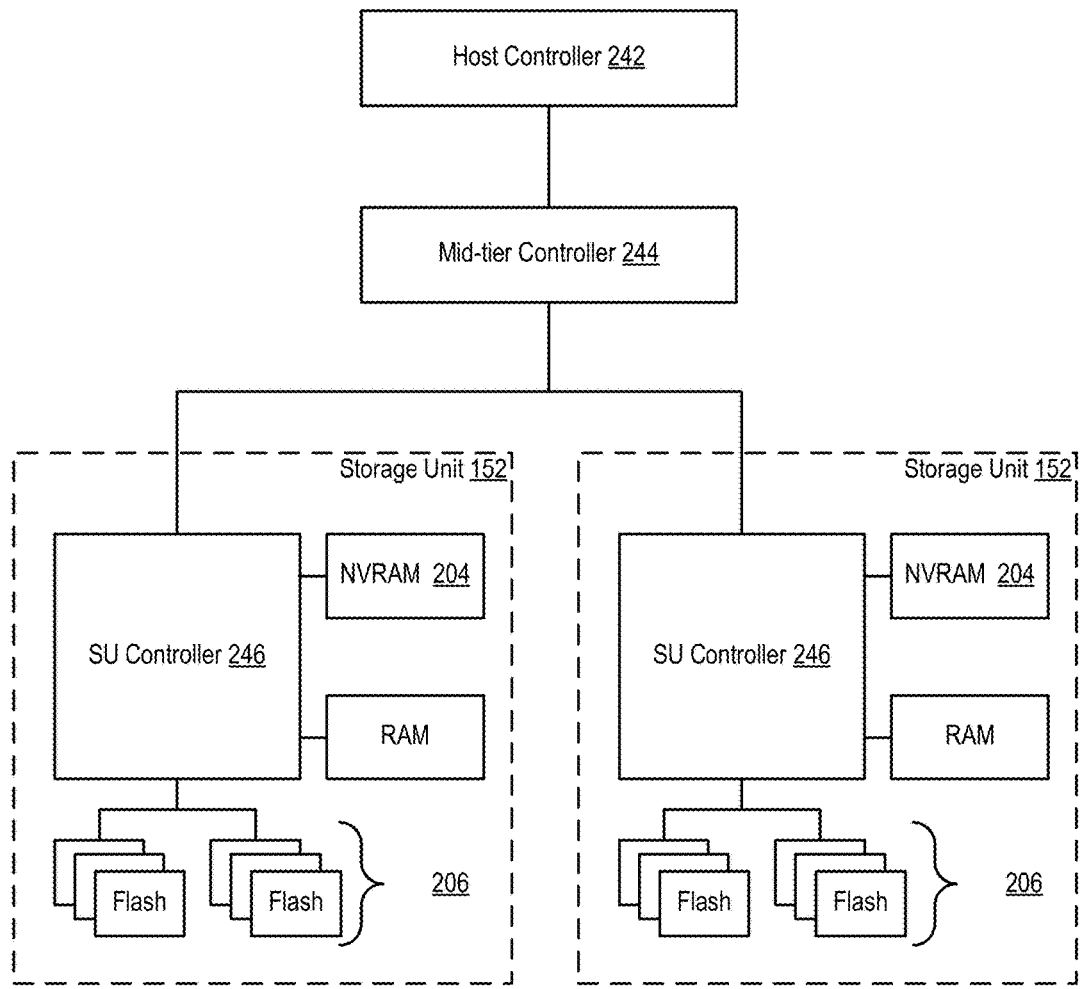
FIG. 2D shows a storage server environment, which uses embodiments of the storage nodes and storage units of some previous figures in accordance with some embodiments.

FIG. 2D shows a storage server environment, which uses embodiments of the storage nodes 150 and storage units 152 of FIGS. 2A-C. In this version, each storage unit 152 has a processor such as controller 212 (see FIG. 2C), an FPGA (field programmable gate array), flash memory 206, and NVRAM 204 (which is super-capacitor backed DRAM 216, see FIGS. 2B and 2C) on a PCIe (peripheral component interconnect express) board in a chassis 138 (see FIG. 2A).

The storage unit 152 may be implemented as a single board containing storage, and may be the largest tolerable failure domain inside the chassis. In some embodiments, up to two storage units 152 may fail and the device will continue with no data loss.

The physical storage is divided into named regions based on application usage in some embodiments. The NVRAM 204 is a contiguous block of reserved memory in the storage unit 152 DRAM 216, and is backed by NAND flash. NVRAM 204 is logically divided into multiple memory regions written for two as spool (e.g., spool_region). Space within the NVRAM 204 spools is managed by each authority 168 independently. Each device provides an amount of storage space to each authority 168. That authority 168 further manages lifetimes and allocations within that space. Examples of a spool include distributed transactions or notions. When the primary power to a storage unit 152 fails, onboard super-capacitors provide a short duration of power hold up. During this holdup interval, the contents of the NVRAM 204 are flushed to flash memory 206. On the next power-on, the contents of the NVRAM 204 are recovered from the flash memory 206.

As for the storage unit controller, the responsibility of the logical "controller" is distributed across each of the blades containing authorities 168. This distribution of logical control is shown in FIG. 2D as a host controller 242, mid-tier controller 244 and storage unit controller(s) 246. Management of the control plane and the storage plane are treated independently, although parts may be physically co-located on the same blade. Each authority 168 effectively serves as an independent controller. Each authority 168 provides its own data and metadata structures, its own background workers, and maintains its own lifecycle.

Figure 2E:
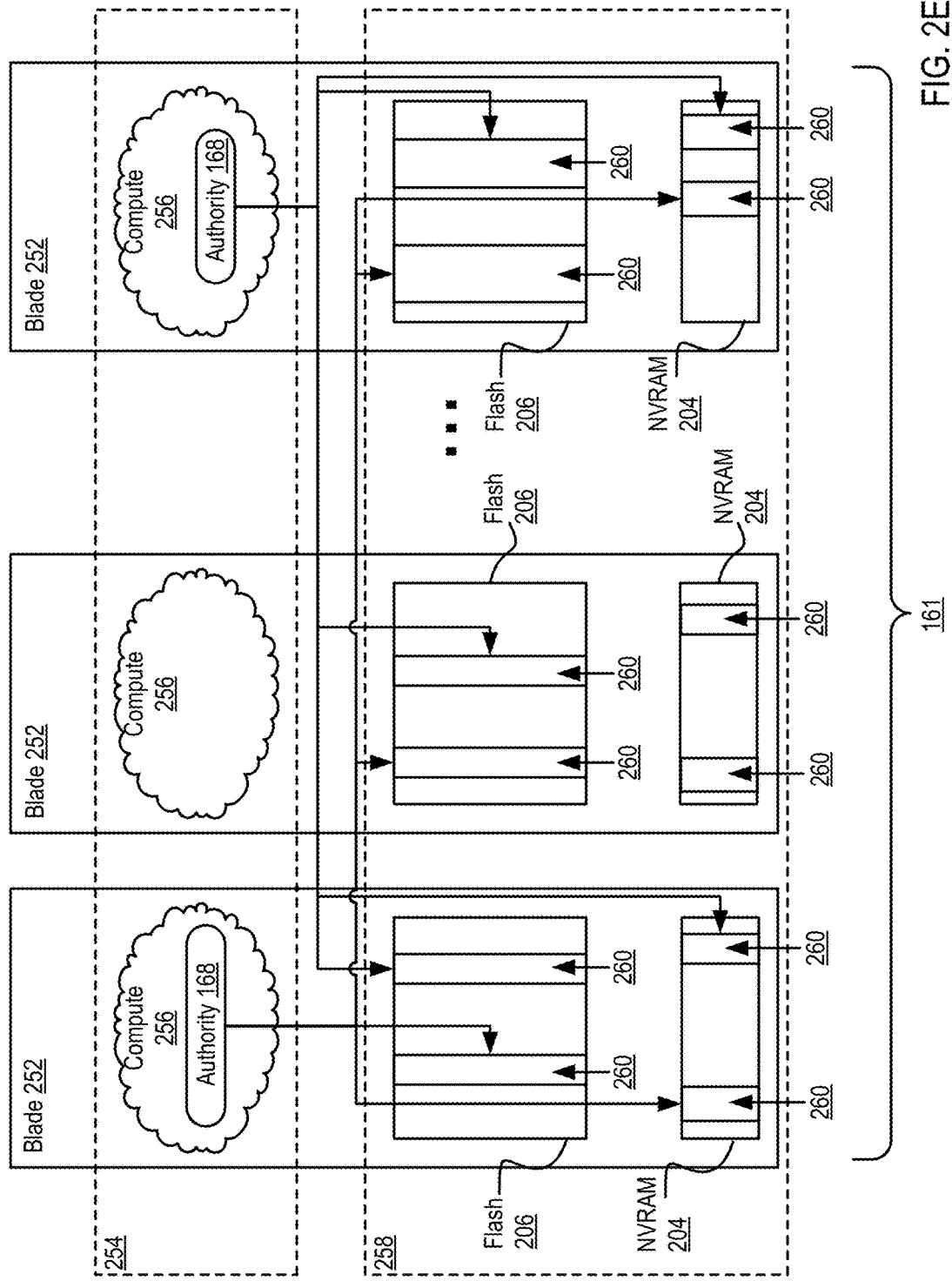
FIG. 2E is a blade hardware block diagram, showing a control plane, compute and storage planes, and authorities interacting with underlying physical resources, in accordance with some embodiments.

FIG. 2E is a blade 252 hardware block diagram, showing a control plane 254, compute and storage planes 256, 258, and authorities 168 interacting with underlying physical resources, using embodiments of the storage nodes 150 and storage units 152 of FIGS. 2A-C in the storage server environment of FIG. 2D. The control plane 254 is partitioned into a number of authorities 168 which can use the compute resources in the compute plane 256 to run on any of the blades 252. The storage plane 258 is partitioned into a set of devices, each of which provides access to flash 206 and NVRAM 204 resources.

In the compute and storage planes 256, 258 of FIG. 2E, the authorities 168 interact with the underlying physical resources (i.e., devices). From the point of view of an authority 168, its resources are striped over all of the physical devices. From the point of view of a device, it provides resources to all authorities 168, irrespective of where the authorities happen to run. Each authority 168 has allocated or has been allocated one or more partitions 260 of storage memory in the storage units 152, e.g. partitions 260 in flash memory 206 and NVRAM 204. Each authority 168 uses those allocated partitions 260 that belong to it, for writing or reading user data. Authorities can be associated with differing amounts of physical storage of the system. For example, one authority 168 could have a larger number of partitions 260 or larger sized partitions 260 in one or more storage units 152 than one or more other authorities 168.

Figure 2F:
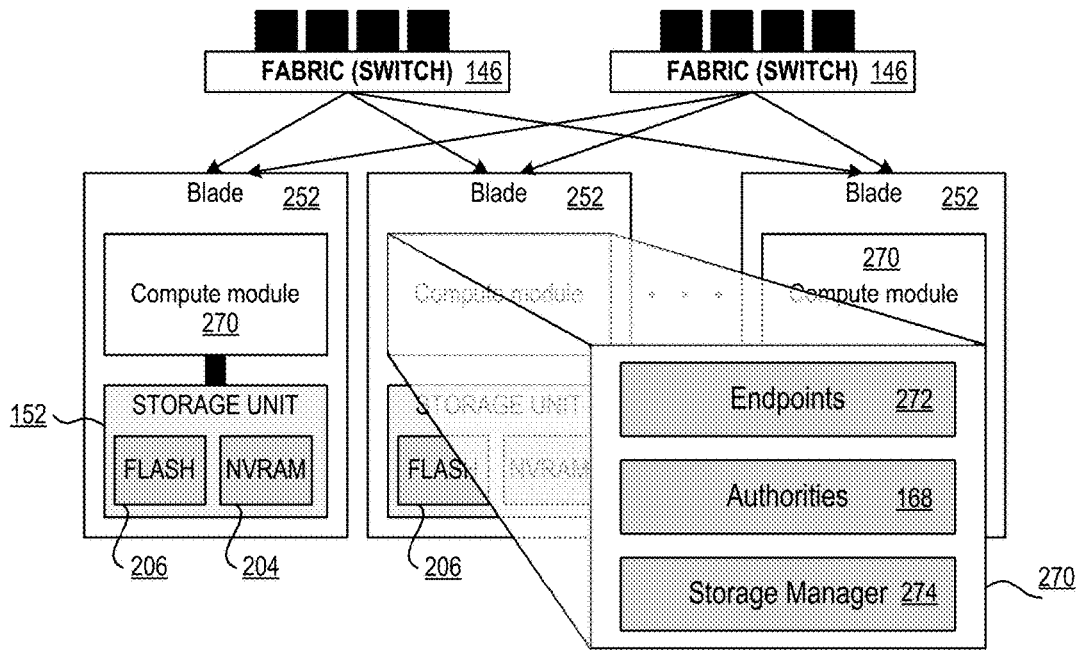
FIG. 2F depicts elasticity software layers in blades of a storage cluster, in accordance with some embodiments.

FIG. 2F depicts elasticity software layers in blades 252 of a storage cluster, in accordance with some embodiments. In the elasticity structure, elasticity software is symmetric, i.e., each blade's compute module 270 runs the three identical layers of processes depicted in FIG. 2F. Storage managers 274 execute read and write requests from other blades 252 for data and metadata stored in local storage unit 152 NVRAM 204 and flash 206. Authorities 168 fulfill client requests by issuing the necessary reads and writes to the blades 252 on whose storage units 152 the corresponding data or metadata resides. Endpoints 272 parse client connection requests received from switch fabric 146 supervisory software, relay the client connection requests to the authorities 168 responsible for fulfillment, and relay the authorities' 168 responses to clients. The symmetric three-layer structure enables the storage system's high degree of concurrency. Elasticity scales out efficiently and reliably in these embodiments. In addition, elasticity implements a unique scale-out technique that balances work evenly across all resources regardless of client access pattern, and maximizes concurrency by eliminating much of the need for inter-blade coordination that typically occurs with conventional distributed locking.

Still referring to FIG. 2F, authorities 168 running in the compute modules 270 of a blade 252 perform the internal operations required to fulfill client requests. One feature of elasticity is that authorities 168 are stateless, i.e., they cache active data and metadata in their own blades' 252 DRAMs for fast access, but the authorities store every update in their NVRAM 204 partitions on three separate blades 252 until the update has been written to flash 206. All the storage system writes to NVRAM 204 are in triplicate to partitions on three separate blades 252 in some embodiments. With triple-mirrored NVRAM 204 and persistent storage protected by parity and Reed-Solomon RAID checksums, the storage system can survive concurrent failure of two blades 252 with no loss of data, metadata, or access to either.

Because authorities 168 are stateless, they can migrate between blades 252. Each authority 168 has a unique identifier. NVRAM 204 and flash 206 partitions are associated with authorities' 168 identifiers, not with the blades 252 on which they are running in some. Thus, when an authority 168 migrates, the authority 168 continues to manage the same storage partitions from its new location. When a new blade 252 is installed in an embodiment of the storage cluster, the system automatically rebalances load by: partitioning the new blade's 252 storage for use by the system's authorities 168, migrating selected authorities 168 to the new blade 252, starting endpoints 272 on the new blade 252 and including them in the switch fabric's 146 client connection distribution algorithm.

From their new locations, migrated authorities 168 persist the contents of their NVRAM 204 partitions on flash 206, process read and write requests from other authorities 168, and fulfill the client requests that endpoints 272 direct to them. Similarly, if a blade 252 fails or is removed, the system redistributes its authorities 168 among the system's remaining blades 252. The redistributed authorities 168 continue to perform their original functions from their new locations.

Figure 2G:
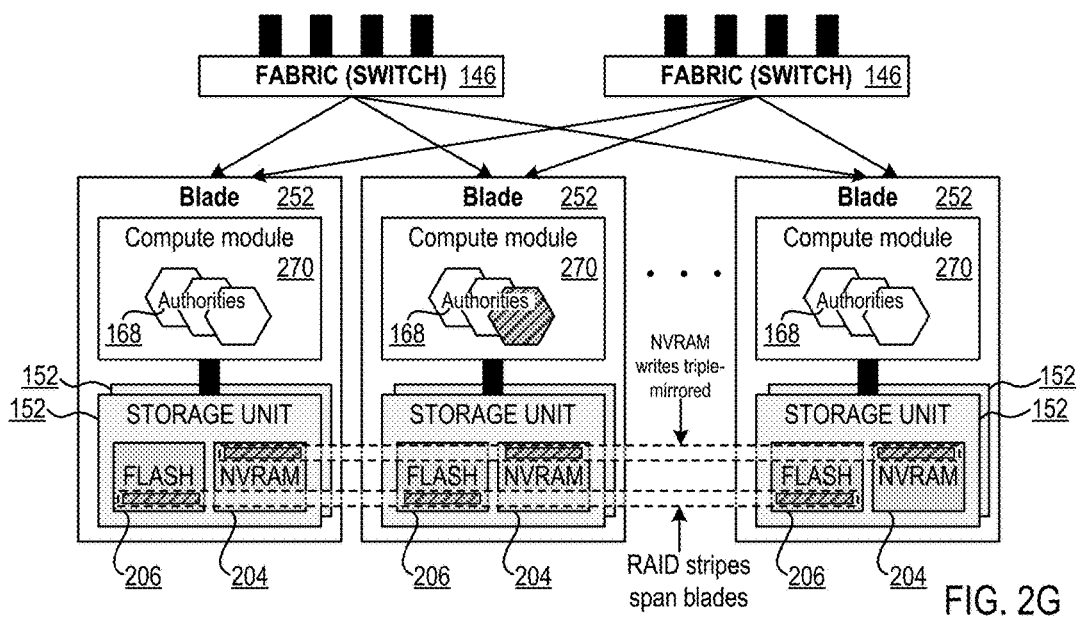
FIG. 2G depicts authorities and storage resources in blades of a storage cluster, in accordance with some embodiments.

FIG. 2G depicts authorities 168 and storage resources in blades 252 of a storage cluster, in accordance with some embodiments. Each authority 168 is exclusively responsible for a partition of the flash 206 and NVRAM 204 on each blade 252. The authority 168 manages the content and integrity of its partitions independently of other authorities 168. Authorities 168 compress incoming data and preserve it temporarily in their NVRAM 204 partitions, and then consolidate, RAID-protect, and persist the data in segments of the storage in their flash 206 partitions. As the authorities 168 write data to flash 206, storage managers 274 perform the necessary flash translation to optimize write performance and maximize media longevity. In the background, authorities 168 "garbage collect," or reclaim space occupied by data that clients have made obsolete by overwriting the data. It should be appreciated that since authorities' 168 partitions are disjoint, there is no need for distributed locking to execute client and writes or to perform background functions.

The embodiments described herein may utilize various software, communication and/or networking protocols. In addition, the configuration of the hardware and/or software may be adjusted to accommodate various protocols. For example, the embodiments may utilize Active Directory, which is a database based system that provides authentication, directory, policy, and other services in a WINDOWS environment. In these embodiments, LDAP (Lightweight Directory Access Protocol) is one example application protocol for querying and modifying items in directory service providers such as Active Directory. In some embodiments, a network lock manager ('NLM') is utilized as a facility that works in cooperation with the Network File System ('NFS') to provide a System V style of advisory file and record locking over a network. The Server Message Block ('SMB') protocol, one version of which is also known as Common Internet File System ('CIFS'), may be integrated with the storage systems discussed herein. SMP operates as an application-layer network protocol typically used for providing shared access to files, printers, and serial ports and miscellaneous communications between nodes on a network. SMB also provides an authenticated inter-process communication mechanism. AMAZON™ S3 (Simple Storage Service) is a web service offered by Amazon Web Services, and the systems described herein may interface with Amazon S3 through web services interfaces (REST (representational state transfer), SOAP (simple object access protocol), and BitTorrent). A RESTful API (application programming interface) breaks down a transaction to create a series of small modules. Each module addresses a particular underlying part of the transaction. The control or permissions provided with these embodiments, especially for object data, may include utilization of an access control list ('ACL'). The ACL is a list of permissions attached to an object and the ACL specifies which users or system processes are granted access to objects, as well as what operations are allowed on given objects. The systems may utilize Internet Protocol version 6 ('IPv6'), as well as IPv4, for the communications protocol that provides an identification and location system for computers on networks and routes traffic across the Internet. The routing of packets between networked systems may include Equal-cost multi-path routing ('ECMP'), which is a routing strategy where next-hop packet forwarding to a single destination can occur over multiple "best paths" which tie for top place in routing metric calculations. Multi-path routing can be used in conjunction with most routing protocols, because it is a per-hop decision limited to a single router. The software may support Multi-tenancy, which is an architecture in which a single instance of a software application serves multiple customers. Each customer may be referred to as a tenant. Tenants may be given the ability to customize some parts of the application, but may not customize the application's code, in some embodiments. The embodiments may maintain audit logs. An audit log is a document that records an event in a computing system. In addition to documenting what resources were accessed, audit log entries typically include destination and source addresses, a timestamp, and user login information for compliance with various regulations. The embodiments may support various key management policies, such as encryption key rotation. In addition, the system may support dynamic root passwords or some variation dynamically changing passwords.

Figure 3A:
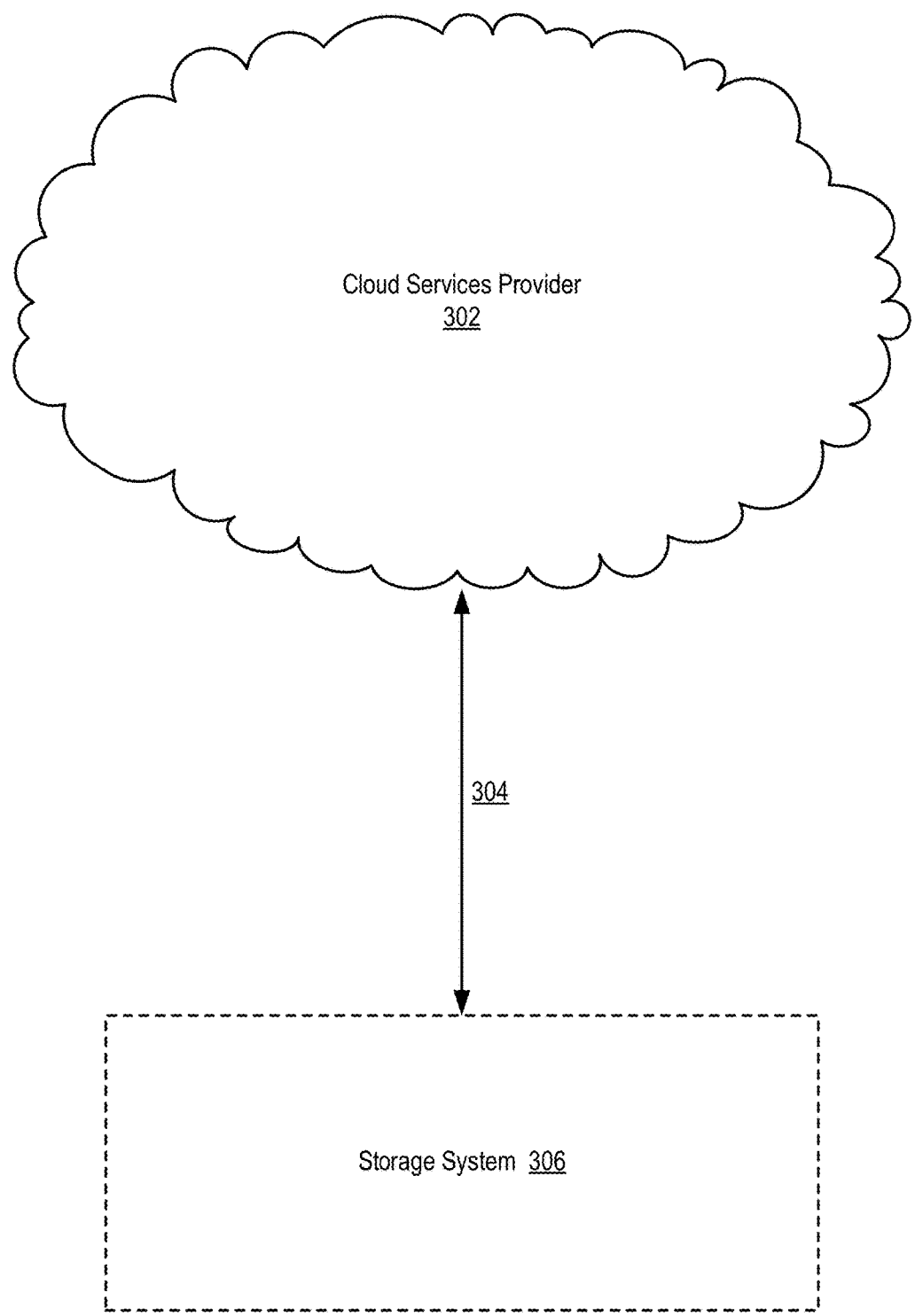
FIG. 3A sets forth a diagram of a storage system that is coupled for data communications with a cloud services provider in accordance with some embodiments of the present disclosure.

FIG. 3A sets forth a diagram of a storage system 306 that is coupled for data communications with a cloud services provider 302 in accordance with some embodiments of the present disclosure. Although depicted in less detail, the storage system 306 depicted in FIG. 3A may be similar to the storage systems described above with reference to FIGS. 1A-1D and FIGS. 2A-2G. In some embodiments, the storage system 306 depicted in FIG. 3A may be embodied as a storage system that includes imbalanced active/active controllers, as a storage system that includes balanced active/active controllers, as a storage system that includes active/active controllers where less than all of each controller's resources are utilized such that each controller has reserve resources that may be used to support failover, as a storage system that includes fully active/active controllers, as a storage system that includes dataset-segregated controllers, as a storage system that includes dual-layer architectures with front-end controllers and back-end integrated storage controllers, as a storage system that includes scale-out clusters of dual-controller arrays, as well as combinations of such embodiments.

In the example depicted in FIG. 3A, the storage system 306 is coupled to the cloud services provider 302 via a data communications link 304. The data communications link 304 may be embodied as a dedicated data communications link, as a data communications pathway that is provided through the use of one or data communications networks such as a wide area network ('WAN') or local area network ('LAN'), or as some other mechanism capable of transporting digital information between the storage system 306 and the cloud services provider 302. Such a data communications link 304 may be fully wired, fully wireless, or some aggregation of wired and wireless data communications pathways. In such an example, digital information may be exchanged between the storage system 306 and the cloud services provider 302 via the data communications link 304 using one or more data communications protocols. For example, digital information may be exchanged between the storage system 306 and the cloud services provider 302 via the data communications link 304 using the handheld device transfer protocol ('HDTP'), hypertext transfer protocol ('HTTP'), internet protocol ('IP'), real-time transfer protocol ('RTP'), transmission control protocol ('TCP'), user datagram protocol ('UDP'), wireless application protocol ('WAP'), or other protocol.

The cloud services provider 302 depicted in FIG. 3A may be embodied, for example, as a system and computing environment that provides services to users of the cloud services provider 302 through the sharing of computing resources via the data communications link 304. The cloud services provider 302 may provide on-demand access to a shared pool of configurable computing resources such as computer networks, servers, storage, applications and services, and so on. The shared pool of configurable resources may be rapidly provisioned and released to a user of the cloud services provider 302 with minimal management effort. Generally, the user of the cloud services provider 302 is unaware of the exact computing resources utilized by the cloud services provider 302 to provide the services. Although in many cases such a cloud services provider 302 may be accessible via the Internet, readers of skill in the art will recognize that any system that abstracts the use of shared resources to provide services to a user through any data communications link may be considered a cloud services provider 302.

In the example depicted in FIG. 3A, the cloud services provider 302 may be configured to provide a variety of services to the storage system 306 and users of the storage system 306 through the implementation of various service models. For example, the cloud services provider 302 may be configured to provide services to the storage system 306 and users of the storage system 306 through the implementation of an infrastructure as a service ('IaaS') service model where the cloud services provider 302 offers computing infrastructure such as virtual machines and other resources as a service to subscribers. In addition, the cloud services provider 302 may be configured to provide services to the storage system 306 and users of the storage system 306 through the implementation of a platform as a service ('PaaS') service model where the cloud services provider 302 offers a development environment to application developers. Such a development environment may include, for example, an operating system, programming-language execution environment, database, web server, or other components that may be utilized by application developers to develop and run software solutions on a cloud platform. Furthermore, the cloud services provider 302 may be configured to provide services to the storage system 306 and users of the storage system 306 through the implementation of a software as a service ('SaaS') service model where the cloud services provider 302 offers application software, databases, as well as the platforms that are used to run the applications to the storage system 306 and users of the storage system 306, providing the storage system 306 and users of the storage system 306 with on-demand software and eliminating the need to install and run the application on local computers, which may simplify maintenance and support of the application. The cloud services provider 302 may be further configured to provide services to the storage system 306 and users of the storage system 306 through the implementation of an authentication as a service ('AaaS') service model where the cloud services provider 302 offers authentication services that can be used to secure access to applications, data sources, or other resources. The cloud services provider 302 may also be configured to provide services to the storage system 306 and users of the storage system 306 through the implementation of a storage as a service model where the cloud services provider 302 offers access to its storage infrastructure for use by the storage system 306 and users of the storage system 306. Readers will appreciate that the cloud services provider 302 may be configured to provide additional services to the storage system 306 and users of the storage system 306 through the implementation of additional service models, as the service models described above are included only for explanatory purposes and in no way represent a limitation of the services that may be offered by the cloud services provider 302 or a limitation as to the service models that may be implemented by the cloud services provider 302.

In the example depicted in FIG. 3A, the cloud services provider 302 may be embodied, for example, as a private cloud, as a public cloud, or as a combination of a private cloud and public cloud. In an embodiment in which the cloud services provider 302 is embodied as a private cloud, the cloud services provider 302 may be dedicated to providing services to a single organization rather than providing services to multiple organizations. In an embodiment where the cloud services provider 302 is embodied as a public cloud, the cloud services provider 302 may provide services to multiple organizations. Public cloud and private cloud deployment models may differ and may come with various advantages and disadvantages. For example, because a public cloud deployment involves the sharing of a computing infrastructure across different organization, such a deployment may not be ideal for organizations with security concerns, mission-critical workloads, uptime requirements demands, and so on. While a private cloud deployment can address some of these issues, a private cloud deployment may require on-premises staff to manage the private cloud. In still alternative embodiments, the cloud services provider 302 may be embodied as a mix of a private and public cloud services with a hybrid cloud deployment.

Although not explicitly depicted in FIG. 3A, readers will appreciate that additional hardware components and additional software components may be necessary to facilitate the delivery of cloud services to the storage system 306 and users of the storage system 306. For example, the storage system 306 may be coupled to (or even include) a cloud storage gateway. Such a cloud storage gateway may be embodied, for example, as hardware-based or software-based appliance that is located on premise with the storage system 306. Such a cloud storage gateway may operate as a bridge between local applications that are executing on the storage array 306 and remote, cloud-based storage that is utilized by the storage array 306. Through the use of a cloud storage gateway, organizations may move primary iSCSI or NAS to the cloud services provider 302, thereby enabling the organization to save space on their on-premises storage systems. Such a cloud storage gateway may be configured to emulate a disk array, a block-based device, a file server, or other storage system that can translate the SCSI commands, file server commands, or other appropriate command into REST-space protocols that facilitate communications with the cloud services provider 302.

In order to enable the storage system 306 and users of the storage system 306 to make use of the services provided by the cloud services provider 302, a cloud migration process may take place during which data, applications, or other elements from an organization's local systems (or even from another cloud environment) are moved to the cloud services provider 302. In order to successfully migrate data, applications, or other elements to the cloud services provider's 302 environment, middleware such as a cloud migration tool may be utilized to bridge gaps between the cloud services provider's 302 environment and an organization's environment. Such cloud migration tools may also be configured to address potentially high network costs and long transfer times associated with migrating large volumes of data to the cloud services provider 302, as well as addressing security concerns associated with sensitive data to the cloud services provider 302 over data communications networks. In order to further enable the storage system 306 and users of the storage system 306 to make use of the services provided by the cloud services provider 302, a cloud orchestrator may also be used to arrange and coordinate automated tasks in pursuit of creating a consolidated process or workflow. Such a cloud orchestrator may perform tasks such as configuring various components, whether those components are cloud components or on-premises components, as well as managing the interconnections between such components. The cloud orchestrator can simplify the inter-component communication and connections to ensure that links are correctly configured and maintained.

In the example depicted in FIG. 3A, and as described briefly above, the cloud services provider 302 may be configured to provide services to the storage system 306 and users of the storage system 306 through the usage of a SaaS service model where the cloud services provider 302 offers application software, databases, as well as the platforms that are used to run the applications to the storage system 306 and users of the storage system 306, providing the storage system 306 and users of the storage system 306 with on-demand software and eliminating the need to install and run the application on local computers, which may simplify maintenance and support of the application. Such applications may take many forms in accordance with various embodiments of the present disclosure. For example, the cloud services provider 302 may be configured to provide access to data analytics applications to the storage system 306 and users of the storage system 306. Such data analytics applications may be configured, for example, to receive telemetry data phoned home by the storage system 306. Such telemetry data may describe various operating characteristics of the storage system 306 and may be analyzed, for example, to determine the health of the storage system 306, to identify workloads that are executing on the storage system 306, to predict when the storage system 306 will run out of various resources, to recommend configuration changes, hardware or software upgrades, workflow migrations, or other actions that may improve the operation of the storage system 306.

The cloud services provider 302 may also be configured to provide access to virtualized computing environments to the storage system 306 and users of the storage system 306. Such virtualized computing environments may be embodied, for example, as a virtual machine or other virtualized computer hardware platforms, virtual storage devices, virtualized computer network resources, and so on. Examples of such virtualized environments can include virtual machines that are created to emulate an actual computer, virtualized desktop environments that separate a logical desktop from a physical machine, virtualized file systems that allow uniform access to different types of concrete file systems, and many others.

Figure 3B:
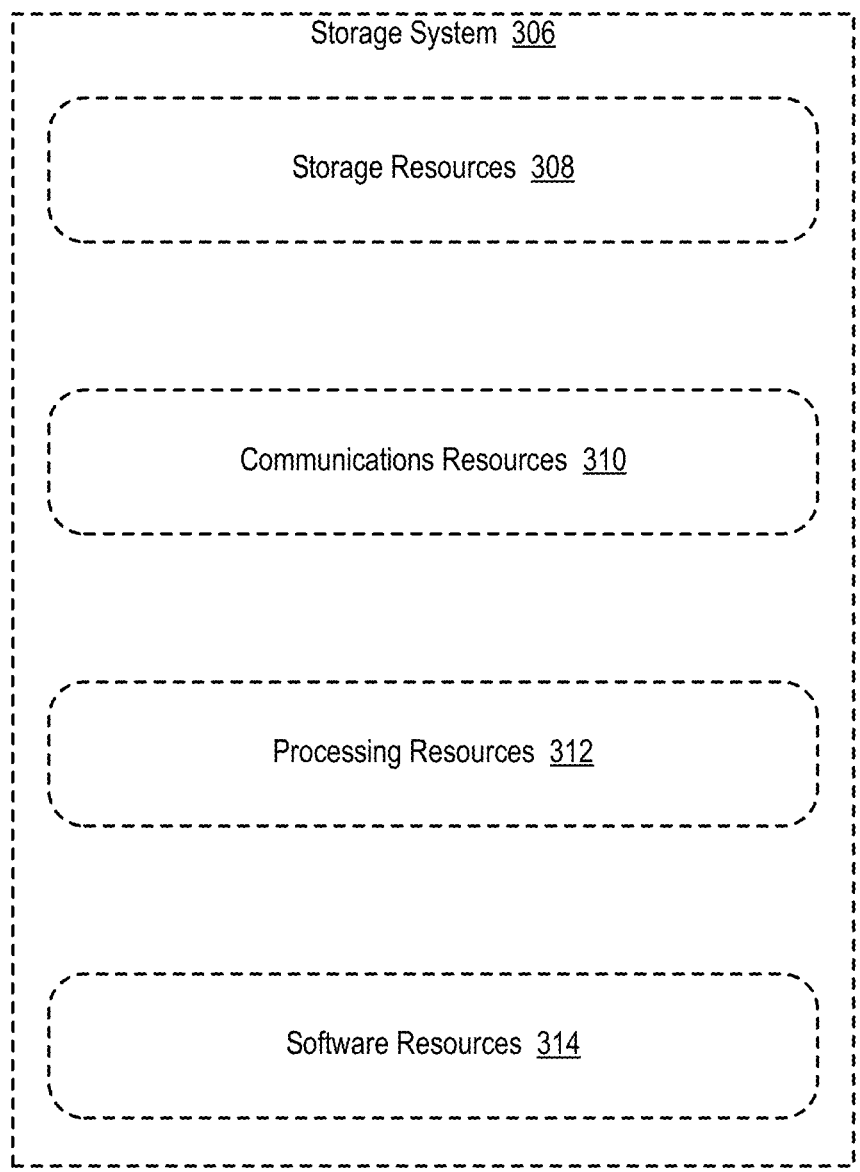
FIG. 3B sets forth a diagram of a storage system in accordance with some embodiments of the present disclosure.

For further explanation, FIG. 3B sets forth a diagram of a storage system 306 in accordance with some embodiments of the present disclosure. Although depicted in less detail, the storage system 306 depicted in FIG. 3B may be similar to the storage systems described above with reference to FIGS. 1A-1D and FIGS. 2A-2G as the storage system may include many of the components described above.

The storage system 306 depicted in FIG. 3B may include storage resources 308, which may be embodied in many forms. For example, in some embodiments the storage resources 308 can include nano-RAM or another form of nonvolatile random access memory that utilizes carbon nanotubes deposited on a substrate. In some embodiments, the storage resources 308 may include 3D crosspoint non-volatile memory in which bit storage is based on a change of bulk resistance, in conjunction with a stackable cross-gridded data access array. In some embodiments, the storage resources 308 may include flash memory, including single-level cell ('SLC') NAND flash, multi-level cell ('MLC') NAND flash, triple-level cell ('TLC') NAND flash, quad-level cell ('QLC') NAND flash, and others. In some embodiments, the storage resources 308 may include non-volatile magnetoresistive random-access memory ('MRAM'), including spin transfer torque ('STT') MRAM, in which data is stored through the use of magnetic storage elements. In some embodiments, the example storage resources 308 may include non-volatile phase-change memory ('PCM') that may have the ability to hold multiple bits in a single cell as cells can achieve a number of distinct intermediary states. In some embodiments, the storage resources 308 may include quantum memory that allows for the storage and retrieval of photonic quantum information. In some embodiments, the example storage resources 308 may include resistive random-access memory ('ReRAM') in which data is stored by changing the resistance across a dielectric solid-state material. In some embodiments, the storage resources 308 may include storage class memory ('SCM') in which solid-state nonvolatile memory may be manufactured at a high density using some combination of sub-lithographic patterning techniques, multiple bits per cell, multiple layers of devices, and so on. Readers will appreciate that other forms of computer memories and storage devices may be utilized by the storage systems described above, including DRAM, SRAM, EEPROM, universal memory, and many others. The storage resources 308 depicted in FIG. 3A may be embodied in a variety of form factors, including but not limited to, dual in-line memory modules ('DIMMs'), non-volatile dual in-line memory modules ('NVDIMMs'), M.2, U.2, and others.

The example storage system 306 depicted in FIG. 3B may implement a variety of storage architectures. For example, storage systems in accordance with some embodiments of the present disclosure may utilize block storage where data is stored in blocks, and each block essentially acts as an individual hard drive. Storage systems in accordance with some embodiments of the present disclosure may utilize object storage, where data is managed as objects. Each object may include the data itself, a variable amount of metadata, and a globally unique identifier, where object storage can be implemented at multiple levels (e.g., device level, system level, interface level). Storage systems in accordance with some embodiments of the present disclosure utilize file storage in which data is stored in a hierarchical structure. Such data may be saved in files and folders, and presented to both the system storing it and the system retrieving it in the same format.

The example storage system 306 depicted in FIG. 3B may be embodied as a storage system in which additional storage resources can be added through the use of a scale-up model, additional storage resources can be added through the use of a scale-out model, or through some combination thereof. In a scale-up model, additional storage may be added by adding additional storage devices. In a scale-out model, however, additional storage nodes may be added to a cluster of storage nodes, where such storage nodes can include additional processing resources, additional networking resources, and so on.

The storage system 306 depicted in FIG. 3B also includes communications resources 310 that may be useful in facilitating data communications between components within the storage system 306, as well as data communications between the storage system 306 and computing devices that are outside of the storage system 306. The communications resources 310 may be configured to utilize a variety of different protocols and data communication fabrics to facilitate data communications between components within the storage systems as well as computing devices that are outside of the storage system. For example, the communications resources 310 can include fibre channel ('FC') technologies such as FC fabrics and FC protocols that can transport SCSI commands over FC networks. The communications resources 310 can also include FC over ethernet ('FCoE') technologies through which FC frames are encapsulated and transmitted over Ethernet networks. The communications resources 310 can also include InfiniBand ('IB') technologies in which a switched fabric topology is utilized to facilitate transmissions between channel adapters. The communications resources 310 can also include NVM Express ('NVMe') technologies and NVMe over fabrics ('NVMeoF') technologies through which non-volatile storage media attached via a PCI express ('PCIe') bus may be accessed. The communications resources 310 can also include mechanisms for accessing storage resources 308 within the storage system 306 utilizing serial attached SCSI ('SAS'), serial ATA ('SATA') bus interfaces for connecting storage resources 308 within the storage system 306 to host bus adapters within the storage system 306, internet small computer systems interface ('iSCSI') technologies to provide block-level access to storage resources 308 within the storage system 306, and other communications resources that that may be useful in facilitating data communications between components within the storage system 306, as well as data communications between the storage system 306 and computing devices that are outside of the storage system 306.

The storage system 306 depicted in FIG. 3B also includes processing resources 312 that may be useful in useful in executing computer program instructions and performing other computational tasks within the storage system 306. The processing resources 312 may include one or more application-specific integrated circuits ('ASICs') that are customized for some particular purpose as well as one or more central processing units ('CPUs'). The processing resources 312 may also include one or more digital signal processors ('DSPs'), one or more field-programmable gate arrays ('FPGAs'), one or more systems on a chip ('SoCs'), or other form of processing resources 312. The storage system 306 may utilize the storage resources 312 to perform a variety of tasks including, but not limited to, supporting the execution of software resources 314 that will be described in greater detail below.

The storage system 306 depicted in FIG. 3B also includes software resources 314 that, when executed by processing resources 312 within the storage system 306, may perform various tasks. The software resources 314 may include, for example, one or more modules of computer program instructions that when executed by processing resources 312 within the storage system 306 are useful in carrying out various data protection techniques to preserve the integrity of data that is stored within the storage systems. Readers will appreciate that such data protection techniques may be carried out, for example, by system software executing on computer hardware within the storage system, by a cloud services provider, or in other ways. Such data protection techniques can include, for example, data archiving techniques that cause data that is no longer actively used to be moved to a separate storage device or separate storage system for long-term retention, data backup techniques through which data stored in the storage system may be copied and stored in a distinct location to avoid data loss in the event of equipment failure or some other form of catastrophe with the storage system, data replication techniques through which data stored in the storage system is replicated to another storage system such that the data may be accessible via multiple storage systems, data snapshotting techniques through which the state of data within the storage system is captured at various points in time, data and database cloning techniques through which duplicate copies of data and databases may be created, and other data protection techniques. Through the use of such data protection techniques, business continuity and disaster recovery objectives may be met as a failure of the storage system may not result in the loss of data stored in the storage system.

The software resources 314 may also include software that is useful in implementing software-defined storage ('SDS'). In such an example, the software resources 314 may include one or more modules of computer program instructions that, when executed, are useful in policy-based provisioning and management of data storage that is independent of the underlying hardware. Such software resources 314 may be useful in implementing storage virtualization to separate the storage hardware from the software that manages the storage hardware.

The software resources 314 may also include software that is useful in facilitating and optimizing I/O operations that are directed to the storage resources 308 in the storage system 306. For example, the software resources 314 may include software modules that perform carry out various data reduction techniques such as, for example, data compression, data deduplication, and others. The software resources 314 may include software modules that intelligently group together I/O operations to facilitate better usage of the underlying storage resource 308, software modules that perform data migration operations to migrate from within a storage system, as well as software modules that perform other functions. Such software resources 314 may be embodied as one or more software containers or in many other ways.

Readers will appreciate that the various components depicted in FIG. 3B may be grouped into one or more optimized computing packages as converged infrastructures. Such converged infrastructures may include pools of computers, storage and networking resources that can be shared by multiple applications and managed in a collective manner using policy-driven processes. Such converged infrastructures may minimize compatibility issues between various components within the storage system 306 while also reducing various costs associated with the establishment and operation of the storage system 306. Such converged infrastructures may be implemented with a converged infrastructure reference architecture, with standalone appliances, with a software driven hyper-converged approach, or in other ways.

Readers will appreciate that the storage system 306 depicted in FIG. 3B may be useful for supporting various types of software applications. For example, the storage system 306 may be useful in supporting artificial intelligence applications, database applications, DevOps projects, electronic design automation tools, event-driven software applications, high performance computing applications, simulation applications, high-speed data capture and analysis applications, machine learning applications, media production applications, media serving applications, picture archiving and communication systems ('PACS') applications, software development applications, and many other types of applications by providing storage resources to such applications.

Figure 4:
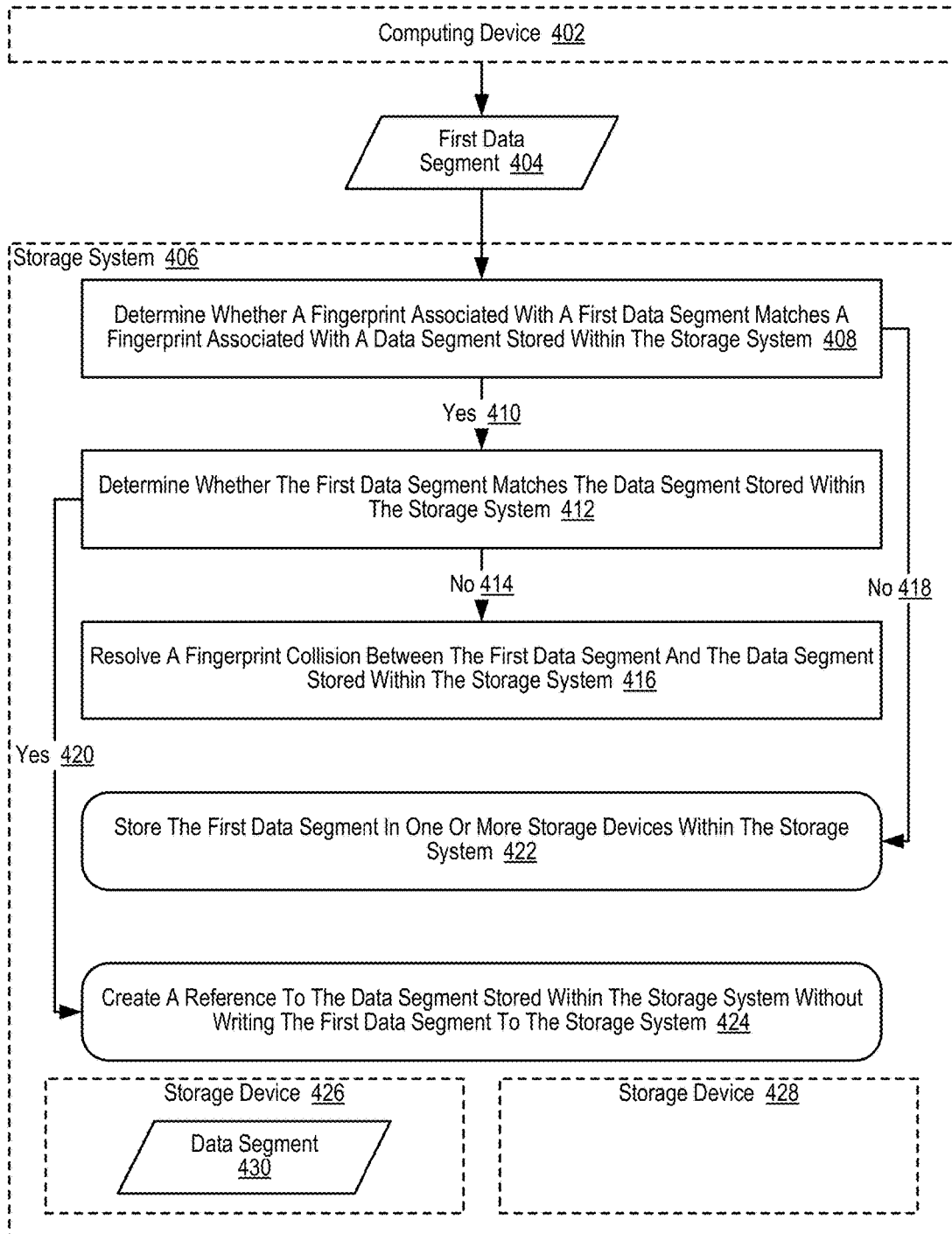
FIG. 4 sets forth a flow chart illustrating an example method of handling fingerprint collisions in a storage system that includes one or more storage devices according to some embodiments of the present disclosure.

For further explanation, FIG. 4 sets forth a flow chart illustrating an example method of handling fingerprint collisions in a storage system (406) that includes one or more storage devices (426, 428) according to some embodiments of the present disclosure. Although depicted in less detail, the storage system (406) depicted in FIG. 4 may be similar to the storage systems described above with reference to FIGS. 1A-1D, FIGS. 2A-2G, FIGS. 3A-3B, or any combination thereof. In fact, the storage system depicted in FIG. 4 may include the same, fewer, or additional components as the storage systems described above.

The example method depicted in FIG. 4 includes determining (408) whether a fingerprint associated with a first data segment (404) matches a fingerprint associated with a data segment (430) stored within the storage system (406). In the example method depicted in FIG. 4, the fingerprint associated with a first data segment (404) may be embodied, for example, as fixed-length hash value that is generated by applying a hash function to the first data segment (404). Likewise, the fingerprint associated with the data segment (430) stored within the storage system (406) may also be embodied as a fixed-length hash value that is generated by applying the same hash function to the data segment (430) stored within the storage system (406). In such a way, if the fingerprint associated with the first data segment (404) and the fingerprint associated with the data segment (430) stored within the storage system (406) are different, then the first data segment (404) and the data segment (430) stored within the storage system (406) will also be different (i.e., the content of each data segment is not identical). If the fingerprint associated with the first data segment (404) and the fingerprint associated with the data segment (430) stored within the storage system (406) are the same, however, this may be an indication that the first data segment (404) and the data segment (430) stored within the storage system (406) are the same (i.e., the content of each data segment is identical).

In the example method depicted in FIG. 4, determining (408) whether the fingerprint associated with the first data segment (404) matches a fingerprint associated with a data segment (430) stored within the storage system (406) may be carried out, for example, by searching a fingerprint table that includes, as part of each entry in the fingerprint table, fingerprints for a plurality of data segments stored within the storage system (406). In such an example, each data segment stored within the storage system (406) may be associated with a fingerprint and, if an entry is found within the fingerprint table that is identical to the fingerprint associated with the first data segment (404), the storage system (406) may affirmatively (410) determine that the fingerprint associated with the first data segment (404) matches the fingerprint associated with the data segment (430) stored within the storage system (406). If an entry is not found within the fingerprint table that contains a fingerprint that is identical to the fingerprint associated with the first data segment (404), however, the storage system (406) may determine that the fingerprint associated with the first data segment (404) does not (418) match the fingerprint associated with the data segment (430) stored within the storage system (406).

Readers will appreciate that each entry within a fingerprint table may also include information in addition to a fingerprint. Each entry within the fingerprint table may also include, for example, information (e.g., an address) describing the location within the storage system (406) where the data segment associated with the fingerprint resides, information describing whether the entry is still valid, and other information. Readers will also appreciate that such a fingerprint table may be organized in a variety of ways, including being broken up into many distinct tables, to reduce the number of entries that must be searched. The fingerprint table may be organized, for example, such that all fingerprints that start with a first 24 bit pattern are included within a first fingerprint table, all fingerprints that start with a second 24 bit pattern are included within a second fingerprint table, all fingerprints that start with a third 24 bit pattern are included within a third fingerprint table, and so on. In such an example, the first 24 bits of the fingerprint associated with the first data segment (404) may be inspected such that the appropriate fingerprint table may be searched, without the need to search additional tables.

The example method depicted in FIG. 4 also includes, responsive to affirmatively (410) determining that the fingerprint associated with the first data segment (404) matches the fingerprint associated with the data segment (430) stored within the storage system (406), determining (412) whether the first data segment (404) matches the data segment (430) stored within the storage system (406). Determining (412) whether the first data segment (404) matches the data segment (430) stored within the storage system (406) may be carried out, for example, by performing a bit-by-bit comparison of the first data segment (404) to the data segment (430) stored within the storage system (406). In such an example, if it is affirmatively (410) determined that the fingerprint associated with the first data segment (404) matches the fingerprint associated with the data segment (430) stored within the storage system (406) and also determined that the first data segment (404) does not (414) match the data segment (430) stored within the storage system (406), the storage system (406) has identified a fingerprint collision between the first data segment (404) and the data segment (430) stored within the storage system (402). Such a fingerprint collision between two data segments exists when two data segments that do not contain identical data map to the same fingerprint.

The example method depicted in FIG. 4 also includes, responsive to determining that the first data segment (404) does not (414) match the data segment (430) stored within the storage system (406), resolving a fingerprint collision between the first data segment (404) and the data segment (430) stored within the storage system (402). Resolving the fingerprint collision between the first data segment (404) and the data segment (430) stored within the storage system (402) may be carried out, for example, by modifying the fingerprint that is associated with either the first data segment (404), by modifying the fingerprint that is associated with the data segment (430) stored within the storage system (402), by generating new fingerprints for the first data segment (404) and the data segment (430) stored within the storage system (402) using a more collision-resistant hash function, or in many other ways as will be described in greater detail below.

In the example method depicted in FIG. 4, determining (408) whether a fingerprint associated with a first data segment (404) matches a fingerprint associated with a data segment (430) stored within the storage system (406), determining (412) whether the first data segment (404) matches the data segment (430) stored within the storage system (406), and resolving a fingerprint collision between the first data segment (404) and the data segment (430) stored within the storage system (402) may be carried out, for example, by one or more modules of computer program instructions executing on computer hardware. In such an example, the one or more modules of computer program instructions executing on computer hardware may be used to perform at least a portion of a data deduplication process that creates (424) a reference (e.g., a pointer) to the data segment (430) stored within the storage system (402), without writing the first data segment (404) to the storage system (406), in response to affirmatively (420) determining that the first data segment (404) does match the data segment (430) stored within the storage system (406).

The example depicted in FIG. 4 illustrates an example of steps that may be included as part of an 'in-line' data deduplication process that occurs prior to the first data segment (404) being stored within the storage system (406). In the example depicted in FIG. 4, the first data segment (404) is depicted as being received from a computing device (402) (e.g., as part of an incoming write request) such as the computing devices described above that issue I/O requests to the storage system (406). In such an example, when the storage system (406) determines that the fingerprint associated with the first data segment (404) does not (418) match a set of fingerprints associated with data segments (430) that are stored within the storage system (406), the storage system (406) may proceed by storing (422) the first data segment (404) in one or more storage devices (426, 428) within the storage system (406). Readers will appreciate that in alternative embodiments, however, a data deduplication process may be applied to data that is already stored within the storage system (406), such that the first data segment (404) may already be stored on one or more storage devices (426, 428) within the storage system (406). In fact, the storage system (406) may implement a first data deduplication process that occurs prior to the first data segment (404) being stored within the storage system (406) as well as a second data deduplication process that occurs after the first data segment (404) has been stored on one or more storage devices (426, 428) within the storage system (406).

In an embodiment where multiple data deduplication processes are performed, the first data deduplication process may include comparing a fingerprint associated with a first data segment (404) to a relatively small number of fingerprints associated with data segments (430) that are already stored within the storage system (406), such that the first deduplication process only introduces an acceptable amount of delay to the servicing of the I/O request that contained the first data segment (404). The second data deduplication process, however, may include comparing a fingerprint associated with a first data segment (404) to a relatively large number of fingerprints associated with data segments (430) already stored within the storage system (406). For example, the second deduplication process may include comparing a fingerprint for the first data segment (404) to fingerprints for every data segment that already stored within the storage system (406) that hashes to the same hash bucket as the fingerprint for the first data segment (404), comparing a fingerprint for the first data segment (404) to fingerprints for every data segment that is already stored within the storage system (406), or performing some other form of deeper comparison than is carried out by the first deduplication process. Readers will appreciate that while the first data deduplication process may prevent some data segments from ever being written to the storage system (406), the second deduplication process may cause data segments already stored within the storage system (406) to be erased or otherwise invalidated.

Figure 5:
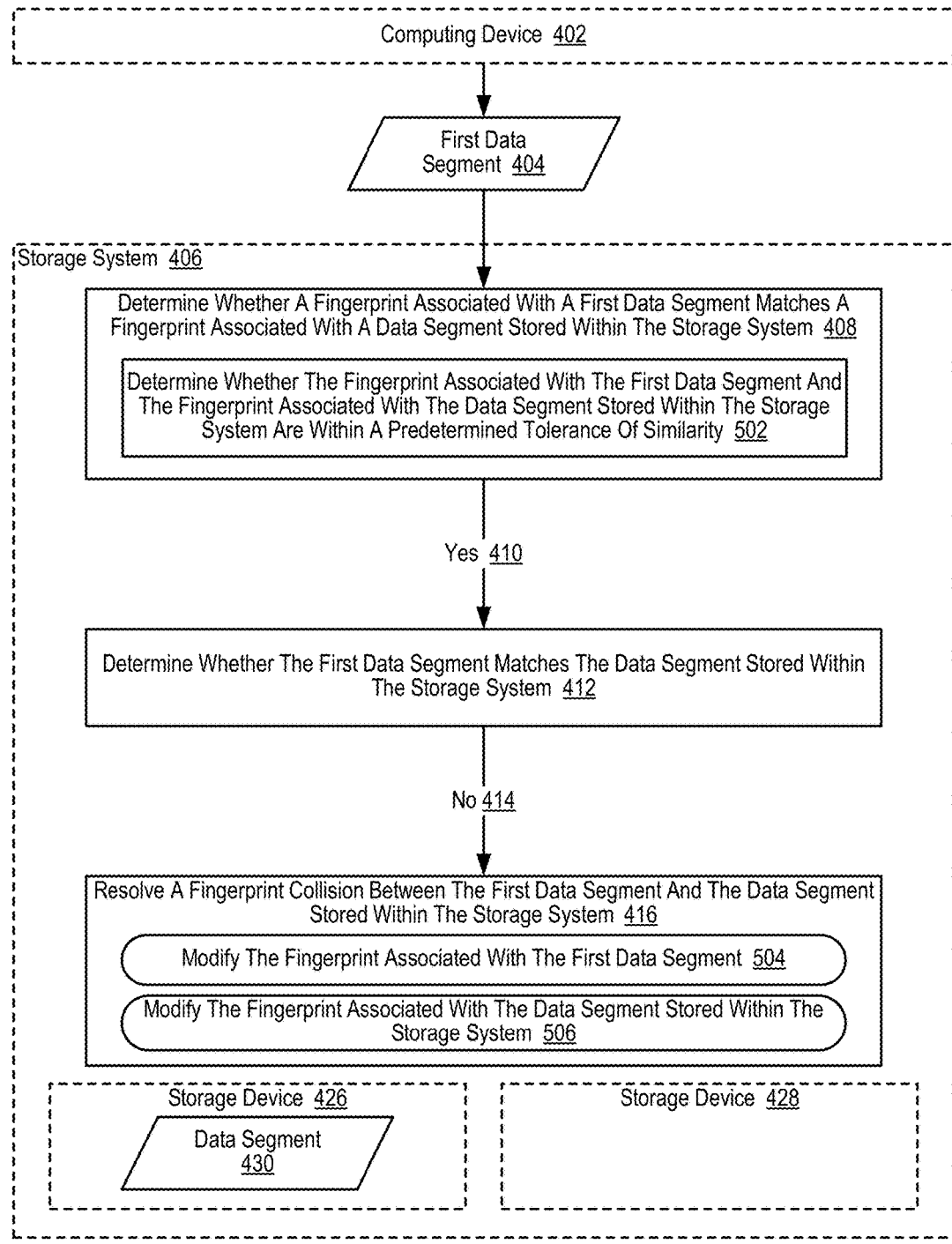
FIG. 5 sets forth a flow chart illustrating an additional example method of handling fingerprint collisions in a storage system that includes one or more storage devices according to some embodiments of the present disclosure.

For further explanation, FIG. 5 sets forth a flow chart illustrating an additional example method of handling fingerprint collisions in a storage system (406) that includes one or more storage devices (426, 428) according to some embodiments of the present disclosure. The example method depicted in FIG. 5 is similar to the example method depicted in FIG. 4, as the example method depicted in FIG. 5 also includes determining (408) whether a fingerprint associated with a first data segment (404) matches a fingerprint associated with a data segment (430) stored within the storage system (406), determining (412) whether the first data segment (404) matches the data segment (430) stored within the storage system (406), and resolving (416) a fingerprint collision between the first data segment (404) and the data segment (430) stored within the storage system (402).

In the example method depicted in FIG. 5, resolving (416) a fingerprint collision between the first data segment (404) and the data segment (430) stored within the storage system (402) can include modifying (504) the fingerprint associated with the first data segment (404). Modifying (504) the fingerprint associated with the first data segment (404) may be carried out, for example, by incrementing the value of the fingerprint associated with the first data segment (404) by a known value (e.g., a value of 1), by decrementing the value of the fingerprint associated with the first data segment (404) by a known value, by adding a small number of additional bits (either as bits appended to the fingerprint or as a replacement of existing bits in the fingerprint) that have a known value to the fingerprint associated with the first data segment (404), or in other ways. Readers will appreciate that by modifying (504) the fingerprint associated with the first data segment (404), the fingerprint associated with the first data segment (404) and the fingerprint associated with the data segment (430) stored within the storage system (406) may no longer match, such that there is no longer a collision between the fingerprints of the two non-identical data segments (404, 430).

In the example method depicted in FIG. 5, resolving (416) a fingerprint collision between the first data segment (404) and the data segment (430) stored within the storage system (402) can also include modifying (506) the fingerprint associated with the data segment (430) stored within the storage system (406). Modifying (506) the fingerprint associated with the data segment (430) stored within the storage system (406) may be carried out, for example, by incrementing the value of the fingerprint associated with the data segment (430) stored within the storage system (406) by a known value, by decrementing the value of the fingerprint associated with the data segment (430) stored within the storage system (406) by a known value, by adding a small number of additional bits (either as bits appended to the fingerprint or as a replacement of existing bits in the fingerprint) that have a known value to the fingerprint associated with the data segment (430) stored within the storage system (406), or in other ways. Readers will appreciate that by modifying (506) the fingerprint associated with the data segment (430) stored within the storage system (406), the fingerprint associated with the first data segment (404) and the fingerprint associated with the data segment (430) stored within the storage system (406) may no longer match, such that there is no longer a collision between the fingerprints of the two non-identical data segments (404, 430).

In the example method depicted FIG. 5, modifying (504) the fingerprint associated with the first data segment (404) and modifying (506) the fingerprint associated with the data segment (430) stored within the storage system (406) can be carried out in many other ways. In some embodiments, either fingerprint may be rehashed (e.g., the fingerprint itself may be run through a hash function again), either fingerprint may be rehashed with a small value appended to the fingerprint, either fingerprint may be rehashed after being incremented or decremented in value, and so on. In yet another alternative embodiment, the data itself (e.g., the first data segment (404) or the data segment (430) stored within the storage system (406)) may be rehashed with a different hash function to generate unique fingerprints for each data segment. Readers will appreciate that any other form of modifying (504, 506) either fingerprint such that the fingerprint collision is resolved (416) can be incorporated into embodiments of the present disclosure.

In the example method depicted in FIG. 5, determining (408) whether a fingerprint associated with a first data segment (404) matches a fingerprint associated with a data segment (430) stored within the storage system (406) can include determining (502) whether the fingerprint associated with the first data segment (404) and the fingerprint associated with the data segment (430) stored within the storage system (406) are within a predetermined tolerance of similarity. The predetermined tolerance of similarity may specify, for example, a number of bits that two fingerprints can vary by in order to still be identified as matching, a specific range of bits that must be identical in order for the two fingerprints to still be identified as matching, an amount that two fingerprints by vary by in value to still be identified as matching, and so on. Readers will appreciate that determining (502) whether the fingerprint associated with the first data segment (404) and the fingerprint associated with the data segment (430) stored within the storage system (406) are within a predetermined tolerance of similarity may be applied to rehashed fingerprints (as described above) and that by determining (502) whether the fingerprint associated with the first data segment (404) and the fingerprint associated with the data segment (430) stored within the storage system (406) are within a predetermined tolerance of similarity, matches to fingerprints that have been modified may still be captured in spite of the fact that two fingerprints may not completely match.

Consider an example in which the fingerprint associated with a first data segment (404) and the fingerprint associated with a data segment (430) stored within the storage system (406) are embodied as 160 bit values that are generated by utilizing a Secure Hash Algorithm 1 ('SHA-1') hash function. In such an example, assume that the fingerprint associated with the first data segment (404) was affirmatively (410) determined to match the fingerprint associated with the data segment (430) stored within the storage system (406), a subsequent determination was made that the first data segment (404) did not (414) match the data segment (430) stored within the storage system (406), and the fingerprint associated with the data segment (430) stored within the storage system (406) was subsequently modified (506) by increasing the 160-bit value by 1 in an effort to resolve (416) the fingerprint collision between the first data segment (404) and the data segment (430) stored within the storage system (406). Readers will appreciate that in view of the fact that the fingerprint associated with the data segment (430) stored within the storage system (406) was modified (506), if a user of the storage system (406) issues a request to write an incoming data segment that is identical to the data segment (430) stored within the storage system (406), a comparison of the fingerprint associated with the data segment (430) stored within the storage system (406) to the fingerprint of the incoming data segment will not yield an exact match. By determining (502) whether the fingerprint associated with the first data segment (404) and the fingerprint associated with the data segment (430) stored within the storage system (406) are within a predetermined tolerance of similarity, however, an exact match is not needed. In fact, because the fingerprint associated with the data segment (430) stored within the storage system (406) and the fingerprint of the incoming data segment will only differ by a value of 1, a predetermined tolerance of similarity which requires that two fingerprints have a value that differs by no more than 1 will result in an affirmative determination that the fingerprint associated with the data segment (430) stored within the storage system (406) and the fingerprint of the incoming data segment are a match. As such, a subsequent comparison of the data segment (430) stored within the storage system (406) and the incoming data segment will result in a match, thereby enabling the storage system (406) to service the request to write an incoming data segment by creating a reference to the data segment (430) stored within the storage system (406) without actually writing the incoming data segment to one or more of the storage devices (426, 428) within the storage system (406).

Consider an additional example in which the fingerprint associated with a first data segment (404) and the fingerprint associated with a data segment (430) stored within the storage system (406) are also embodied as 160 bit values that are generated by utilizing an SHA-1 hash function. In this example, assume that the fingerprint associated with the first data segment (404) was affirmatively (410) determined to match the fingerprint associated with the data segment (430) stored within the storage system (406), a subsequent determination was made that the first data segment (404) did not (414) match the data segment (430) stored within the storage system (406), and the fingerprint associated with the data segment (430) stored within the storage system (406) was subsequently modified (506) by changing a specific group of bits (e.g., bits 143-150) to a value of 0 in an effort to resolve (416) the fingerprint collision between the first data segment (404) and the data segment (430) stored within the storage system (406). Readers will appreciate that in view of the fact that the fingerprint associated with the data segment (430) stored within the storage system (406) was modified (506), if a user of the storage system (406) issues a request to write an incoming data segment that is identical to the data segment (430) stored within the storage system (406), a comparison of the fingerprint associated with the data segment (430) stored within the storage system (406) to the fingerprint of the incoming data segment will not yield an exact match. By determining (502) whether the fingerprint associated with the first data segment (404) and the fingerprint associated with the data segment (430) stored within the storage system (406) are within a predetermined tolerance of similarity, however, an exact match is not needed. In fact, because the fingerprint associated with the data segment (430) stored within the storage system (406) and the fingerprint of the incoming data segment will only differ at bits 143-150, a predetermined tolerance of similarity which requires that two fingerprints have matching values for all bits other than bits 143-150 will result in an affirmative determination that the fingerprint associated with the data segment (430) stored within the storage system (406) and the fingerprint of the incoming data segment are a match. As such, a subsequent comparison of the data segment (430) stored within the storage system (406) and the incoming data segment will result in a match, thereby enabling the storage system (406) to service the request to write an incoming data segment by creating a reference to the data segment (430) stored within the storage system (406) without actually writing the incoming data segment to one or more of the storage devices (426, 428) within the storage system (406).

Readers will appreciate that in the examples described in the preceding paragraph, a relationship exists between that predetermined tolerance of similarity that is used by the storage system (406) to identify matches and the particular modification (504, 506) to a fingerprint that is implemented by the storage system (406). That is, the predetermined tolerance of similarity that is used by the storage system (406) to identify matches may be established by taking into account the particular modifications (504, 506) to a fingerprint that the storage system (406). Furthermore, the utilization of a predetermined tolerance of similarity that is used by the storage system (406) to identify matches may result in multiple matches between the first data segment (404) and data segments (430) stored within the storage system (406), each of which will need to be examined to determine (412) whether the first data segment (404) matches the data segments (430) stored within the storage system (406).

Figure 6:
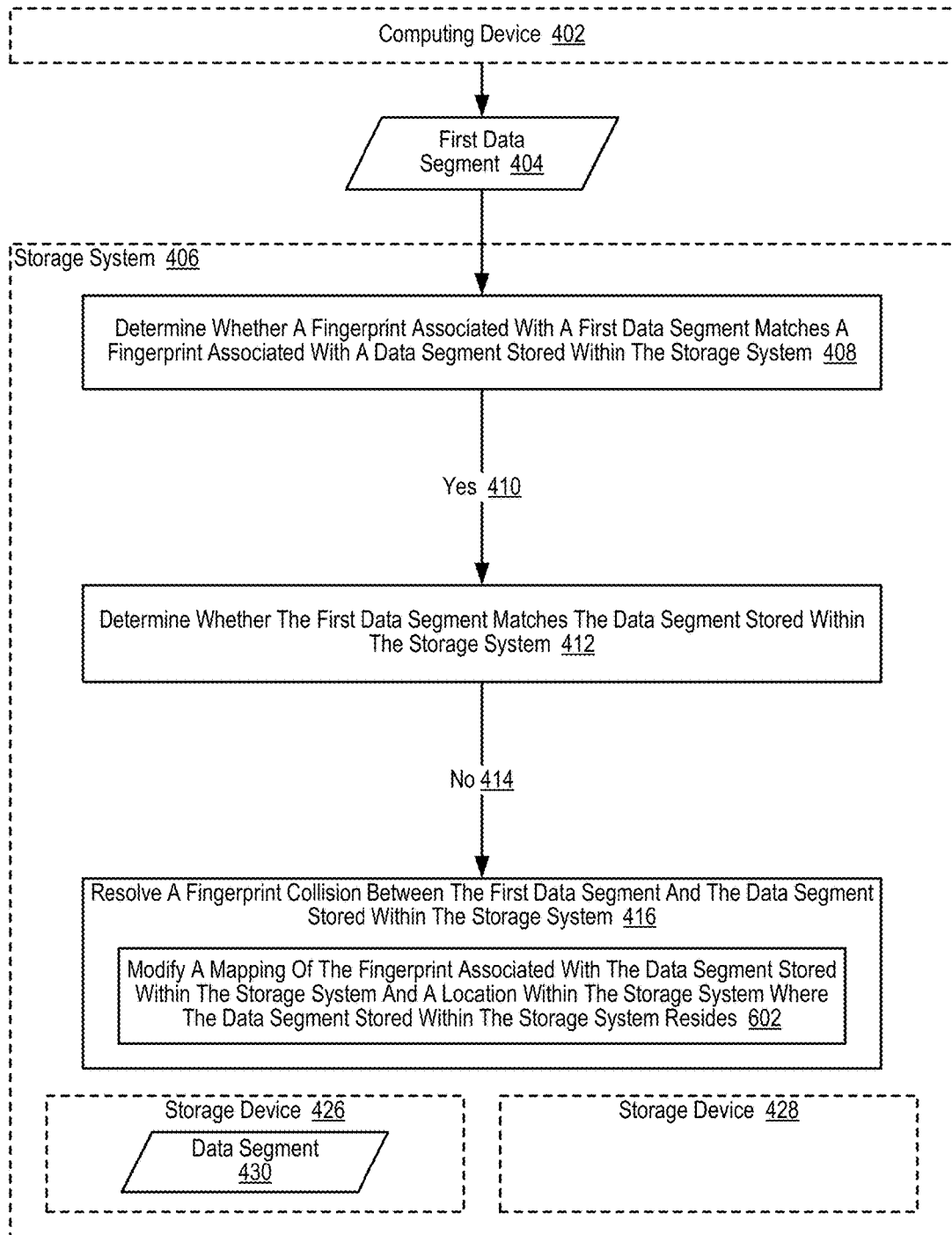
FIG. 6 sets forth a flow chart illustrating an additional example method of handling fingerprint collisions in a storage system that includes one or more storage devices according to some embodiments of the present disclosure.

For further explanation, FIG. 6 sets forth a flow chart illustrating an additional example method of handling fingerprint collisions in a storage system (406) that includes one or more storage devices (426, 428) according to some embodiments of the present disclosure. The example method depicted in FIG. 6 is similar to the example method depicted in FIG. 4, as the example method depicted in FIG. 6 also includes determining (408) whether a fingerprint associated with a first data segment (404) matches a fingerprint associated with a data segment (430) stored within the storage system (406), determining (412) whether the first data segment (404) matches the data segment (430) stored within the storage system (406), and resolving (416) a fingerprint collision between the first data segment (404) and the data segment (430) stored within the storage system (402).

In the example method depicted in FIG. 6, resolving (416) a fingerprint collision between the first data segment (404) and the data segment (430) stored within the storage system (402) can include modifying (602) a mapping of the fingerprint associated with the data segment (430) stored within the storage system (406) and a location within the storage system (406) where the data segment (430) resides. The location within the storage system (406) where the data segment (430) resides may be embodied, for example, as an address (logical or physical) within the storage system (406) where the data segment (430) resides. As such, a mapping of the fingerprint associated with the data segment (430) stored within the storage system (406) and a location within the storage system (406) where the data segment (430) resides may be embodied, for example, as an entry in a fingerprint table, where each entry includes the fingerprint associated with a particular data segment stored within the storage system (406) and an address within the storage system (406) where the particular data segment resides.

In the example method depicted in FIG. 6, modifying (602) the mapping of the fingerprint associated with the data segment (430) stored within the storage system (406) and the location within the storage system (406) where the data segment (430) resides may be carried out in a variety of ways. Modifying (602) the mapping of the fingerprint associated with the data segment (430) stored within the storage system (406) and the location within the storage system (406) where the data segment (430) resides may be carried out, for example, by updating the information describing the location within the storage system (406) where the data segment (430) resides to a value that indicates that a fingerprint collision has been detected. Alternatively, modifying (602) the mapping of the fingerprint associated with the data segment (430) stored within the storage system (406) and the location within the storage system (406) where the data segment (430) resides may be carried out, for example, by flagging (e.g., with a special bit or bit pattern) the mapping to indicate that a fingerprint collision has been detected for the fingerprint. In yet another alternative embodiment, an in-memory table of fingerprints knowns to have collisions could be maintained such that modifying (602) the mapping of the fingerprint associated with the data segment (430) stored within the storage system (406) and the location within the storage system (406) where the data segment (430) resides may be carried out, for example, by creating a new entry in the in-memory table to indicate that a fingerprint collision has been detected for the fingerprint. In such an example, a copy of the in-memory table may be persisted within non-volatile memory and techniques (e.g., a Bloom filter) to allow for quick searching of the entries may be utilized. In order to increase efficiency, the table may be organized in some way by fingerprint value (such as a hash table with sorted buckets, or a summary table linking into a set of sorted values in a variety of log-structured merge trees).

Readers will appreciate that exceptions could be handled in a number of ways. For example, new keys may be generated, stored in some alternate virtual store, or through some alternate storage model, and so on. For example, a well-known fingerprint value (e.g., a string of all 1's, a pattern of 0xa5 hex bytes) could be reserved and any new collision could result in that special fingerprint value being returned and used to store new data in a special volume or some other type of side store. If the internal format for a logical volume or file is a set of fingerprints rather than a set of block pointers, then this special "collision" fingerprint could cause an exception path into an alternate volume-block or file-block to stored block mechanism. Readers will further appreciate that although the examples described above relate to embodiments where the mapping of the fingerprint associated with the data segment (430) stored within the storage system (406) and the location within the storage system (406) where the data segment (430) resides are modified (602), in alternative embodiments, mappings for the fingerprint associated with the first data segment (404) and the location within the storage system (406) where the first data segment (404) resides may be modified.

Figure 7:
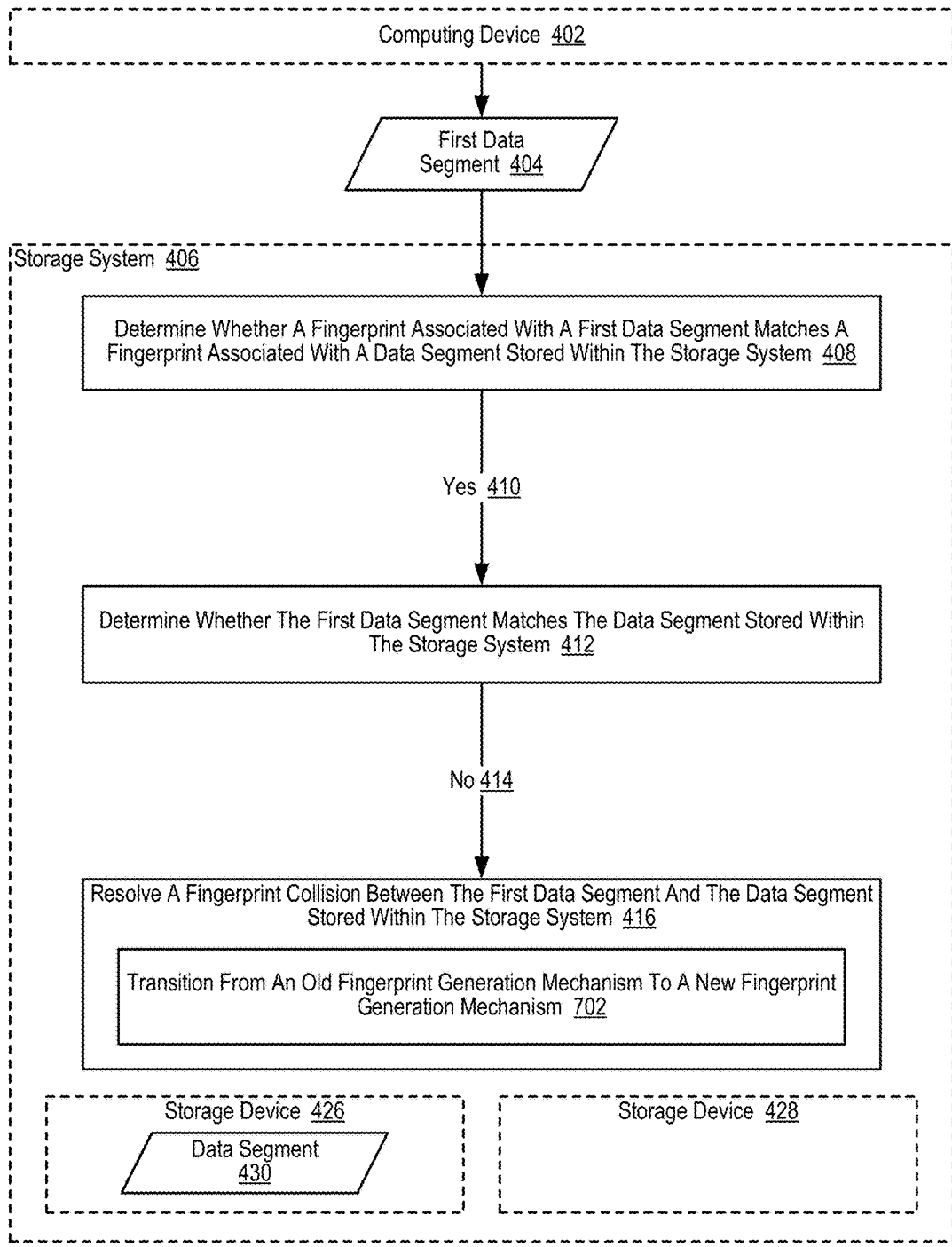
FIG. 7 sets forth a flow chart illustrating an additional example method of handling fingerprint collisions in a storage system that includes one or more storage devices according to some embodiments of the present disclosure.

For further explanation, FIG. 7 sets forth a flow chart illustrating an additional example method of handling fingerprint collisions in a storage system (406) that includes one or more storage devices (426, 428) according to some embodiments of the present disclosure. The example method depicted in FIG. 7 is similar to the example method depicted in FIG. 4, as the example method depicted in FIG. 7 also includes determining (408) whether a fingerprint associated with a first data segment (404) matches a fingerprint associated with a data segment (430) stored within the storage system (406), determining (412) whether the first data segment (404) matches the data segment (430) stored within the storage system (406), and resolving (416) a fingerprint collision between the first data segment (404) and the data segment (430) stored within the storage system (402).

In the example method depicted in FIG. 7, resolving (416) a fingerprint collision between the first data segment (404) and the data segment (430) stored within the storage system (402) can include transitioning (702) from an old fingerprint generation mechanism to a new fingerprint generation mechanism. Transitioning (702) from the old fingerprint generation mechanism to the new fingerprint generation mechanism may be carried out, for example, by transitioning the storage system (406) from generating fingerprints for data segments using a first hash function to generating fingerprints for data segments using a second, more collision-resistant hash function. For example, if the storage system (406) generates fingerprints by utilizing an SHA-1 hash function to generate a 160 bit fingerprint, transitioning (702) from an old fingerprint generation mechanism to a new fingerprint generation mechanism may be carried out, for example, by transitioning the storage system (406) such that the storage system (406) begins generating fingerprints by utilizing an SHA3-224 hash function to generate a 224 bit fingerprint, by utilizing an SHA3-256 hash function to generate a 256 bit fingerprint, or by utilizing some other hash function. Readers will appreciate that transitioning (702) from an old fingerprint generation mechanism to a new fingerprint generation mechanism may be carried out in storage systems whose fingerprint mechanisms have been found to be subject to fingerprint collisions, whether or not such fingerprint collisions have been yet encountered.

Readers will appreciate that, as part of transitioning (702) from an old fingerprint generation mechanism to a new fingerprint generation mechanism, new fingerprints must be generated for data segments that are already stored within the storage system (406). The generation of new fingerprints for data segments that are already stored within the storage system (406) may be a time consuming and resource intensive process, that may require steps such as reading each data segment that is already stored within the storage system (406), generating a new fingerprint for each data segment by applying the new fingerprint generation mechanism to the data segment, creating new mappings for the newly generated fingerprint to a location within the storage system (406) where the data segment resides, and so on. As such, there may be a period of time during which some data segments are associated with fingerprints that were generated using the new fingerprint generation mechanism while other data segments are not yet associated with fingerprints that were generated using the new fingerprint generation mechanism. Such a situation may be handled in a variety of ways, some of which will be explained in greater detail below.

Readers will appreciate that the phrases 'old fingerprint generation mechanism' and 'new fingerprint generation mechanism' are in no way intended to impart any age requirements, time of usage requirements, or other requirements on the respective fingerprint generation mechanisms. The phrases 'old fingerprint generation mechanism' and 'new fingerprint generation mechanism' are only used here for clarity of reference and for ease of explanation. Readers will appreciate that the phrase 'old fingerprint generation mechanism' may be synonymous with the phrase 'first fingerprint generation mechanism' or other appropriate phrase, and the phrase 'new fingerprint generation mechanism' may be synonymous with the phrase 'second fingerprint generation mechanism' or other appropriate phrase.

Figure 8:
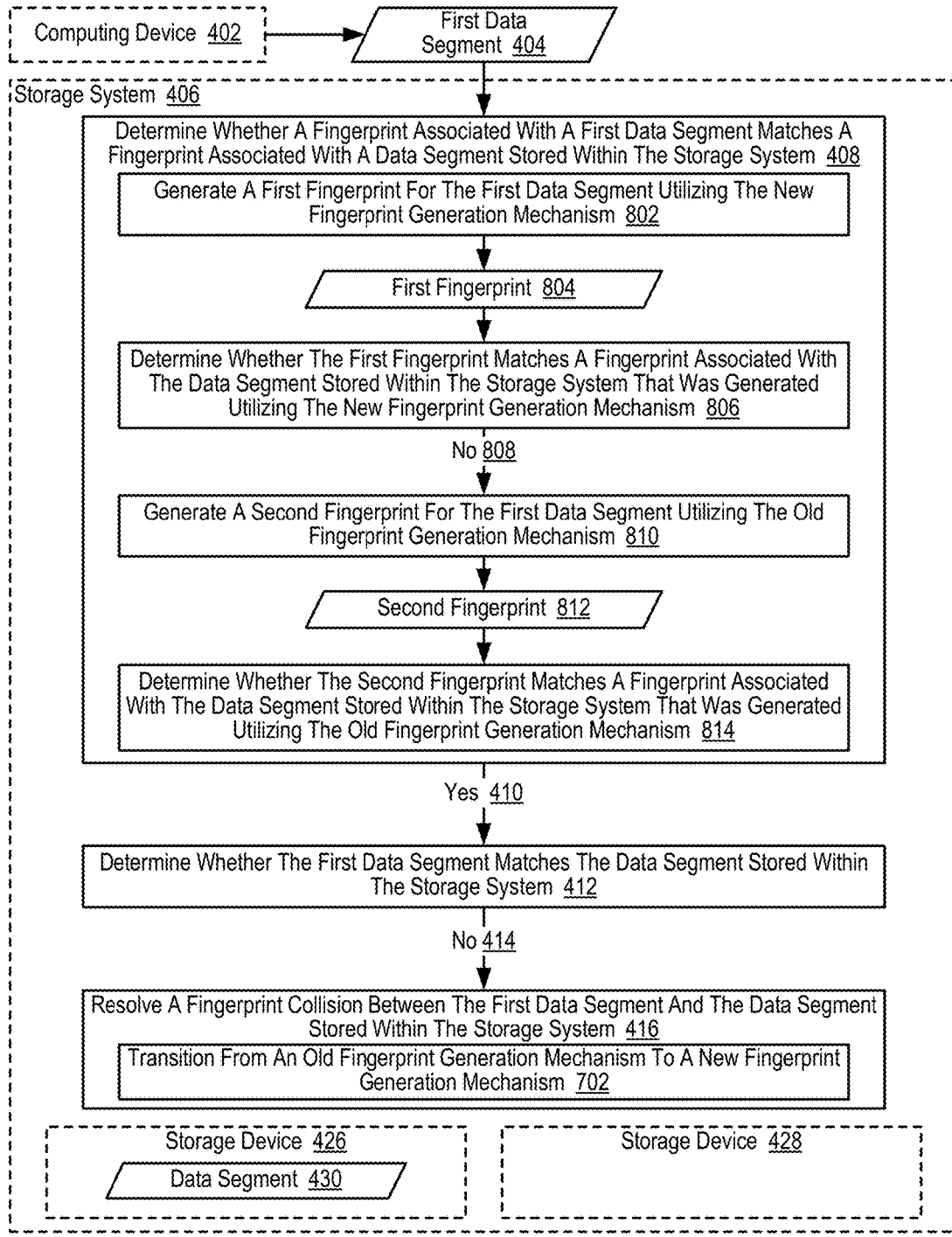
FIG. 8 sets forth a flow chart illustrating an additional example method of handling fingerprint collisions in a storage system that includes one or more storage devices according to some embodiments of the present disclosure.

For further explanation, FIG. 8 sets forth a flow chart illustrating an additional example method of handling fingerprint collisions in a storage system (406) that includes one or more storage devices (426, 428) according to some embodiments of the present disclosure. The example method depicted in FIG. 8 is similar to the example method depicted in FIG. 4, as the example method depicted in FIG. 8 also includes determining (408) whether a fingerprint associated with a first data segment (404) matches a fingerprint associated with a data segment (430) stored within the storage system (406), determining (412) whether the first data segment (404) matches the data segment (430) stored within the storage system (406), and resolving (416) a fingerprint collision between the first data segment (404) and the data segment (430) stored within the storage system (402). The example method depicted in FIG. 8 is also similar to the example method depicted in FIG. 7, as the example method depicted in FIG. 8 also includes transitioning (702) from an old fingerprint generation mechanism to a new fingerprint generation mechanism.

In the example method depicted in FIG. 8, determining (408) whether a fingerprint associated with a first data segment (404) matches a fingerprint associated with a data segment (430) stored within the storage system (406) can include generating (802) a first fingerprint (804) for the first data segment (404) utilizing the new fingerprint generation mechanism. Generating (802) a first fingerprint (804) for the first data segment (404) utilizing the new fingerprint generation mechanism may be carried out, for example, by using the first data segment (404) as input data to a hash function that is used by the new fingerprint generation mechanism. For example, if transitioning (702) from an old fingerprint generation mechanism to a new fingerprint generation mechanism is carried out by transitioning the storage system (406) such that the storage system (406) begins generating fingerprints by utilizing an SHA3-224 hash function to generate a 224 bit fingerprint, generating (802) a first fingerprint (804) for the first data segment (404) utilizing the new fingerprint generation mechanism may be carried out by using the first data segment (404) as input data to an SHA3-224 hash function, and setting the value of the first fingerprint (804) to the resulting 224 bit hash value.

In the example method depicted in FIG. 8, determining (408) whether a fingerprint associated with a first data segment (404) matches a fingerprint associated with a data segment (430) stored within the storage system (406) can also include determining (806) whether the first fingerprint (804) matches a fingerprint associated with the data segment (430) stored within the storage system (406) that was generated utilizing the new fingerprint generation mechanism. Determining (806) whether the first fingerprint (804) matches the fingerprint associated with the data segment (430) stored within the storage system (406) that was generated utilizing the new fingerprint generation mechanism may be carried out, for example, by searching a fingerprint table that includes, as part of each entry in the fingerprint table, fingerprints that were generated utilizing the new fingerprint generation mechanism for a plurality of data segments stored within the storage system (406). In such an example, if an entry that contains a fingerprint that is identical to the first fingerprint (804) is found, the storage system (406) may affirmatively (410) determine that the fingerprint associated with the first data segment (404) matches the fingerprint associated with the data segment (430) stored within the storage system (406). If an entry that contains a fingerprint that is identical to the first fingerprint (804) is not found, however, the storage system (406) may proceed to the step described in the following paragraph.

In the example method depicted in FIG. 8, determining (408) whether a fingerprint associated with a first data segment (404) matches a fingerprint associated with a data segment (430) stored within the storage system (406) can also include generating (810) a second fingerprint (812) for the first data segment (404) utilizing the old fingerprint generation mechanism. Generating (810) a second fingerprint (812) for the first data segment (404) utilizing the old fingerprint generation mechanism may be carried out, for example, by using the first data segment (404) as input data to a hash function that is used by the old fingerprint generation mechanism. For example, if the old fingerprint generation mechanism generates fingerprints by utilizing an SHA-1 hash function to generate a 160 bit fingerprint, generating (810) a second fingerprint (812) for the first data segment (404) utilizing the old fingerprint generation mechanism may be carried out by using the first data segment (404) as input data to an SHA-1 hash function, and setting the value of the second fingerprint (812) to the resulting 160 bit hash value. In the example method depicted in FIG. 8, generating (810) a second fingerprint (812) for the first data segment (404) utilizing the old fingerprint generation mechanism may be carried out in response to determining that the first fingerprint (804) does not (808) match the fingerprint associated with the data segment (430) stored within the storage system (406) that was generated utilizing the new fingerprint generation mechanism.

In the example method depicted in FIG. 8, determining (408) whether a fingerprint associated with a first data segment (404) matches a fingerprint associated with a data segment (430) stored within the storage system (406) can also include determining (814) whether the second fingerprint (812) matches a fingerprint associated with the data segment (430) stored within the storage system (406) that was generated utilizing the old fingerprint generation mechanism. Determining (814) whether the second fingerprint (812) matches a fingerprint associated with the data segment (430) stored within the storage system (406) that was generated utilizing the old fingerprint generation mechanism may be carried out, for example, by searching a fingerprint table that includes, as part of each entry in the fingerprint table, fingerprints that were generated utilizing the old fingerprint generation mechanism for a plurality of data segments stored within the storage system (406). In such an example, if an entry that contains a fingerprint that is identical to the first fingerprint (804) is found, the storage system (406) may affirmatively (410) determine that the fingerprint associated with the first data segment (404) matches the fingerprint associated with the data segment (430) stored within the storage system (406). If an entry that contains a fingerprint that is identical to the first fingerprint (804) is not found, however, the storage system (406) may determine that the fingerprint associated with the first data segment (404) does not matches the fingerprint associated with the data segment (430) stored within the storage system (406). In the example method depicted in FIG. 8, determining (814) whether the second fingerprint (812) matches a fingerprint associated with the data segment (430) stored within the storage system (406) that was generated utilizing the old fingerprint generation mechanism is also carried out in response to determining that the first fingerprint (804) does not (808) match the fingerprint associated with the data segment (430) stored within the storage system (406) that was generated utilizing the new fingerprint generation mechanism.

Figure 9:
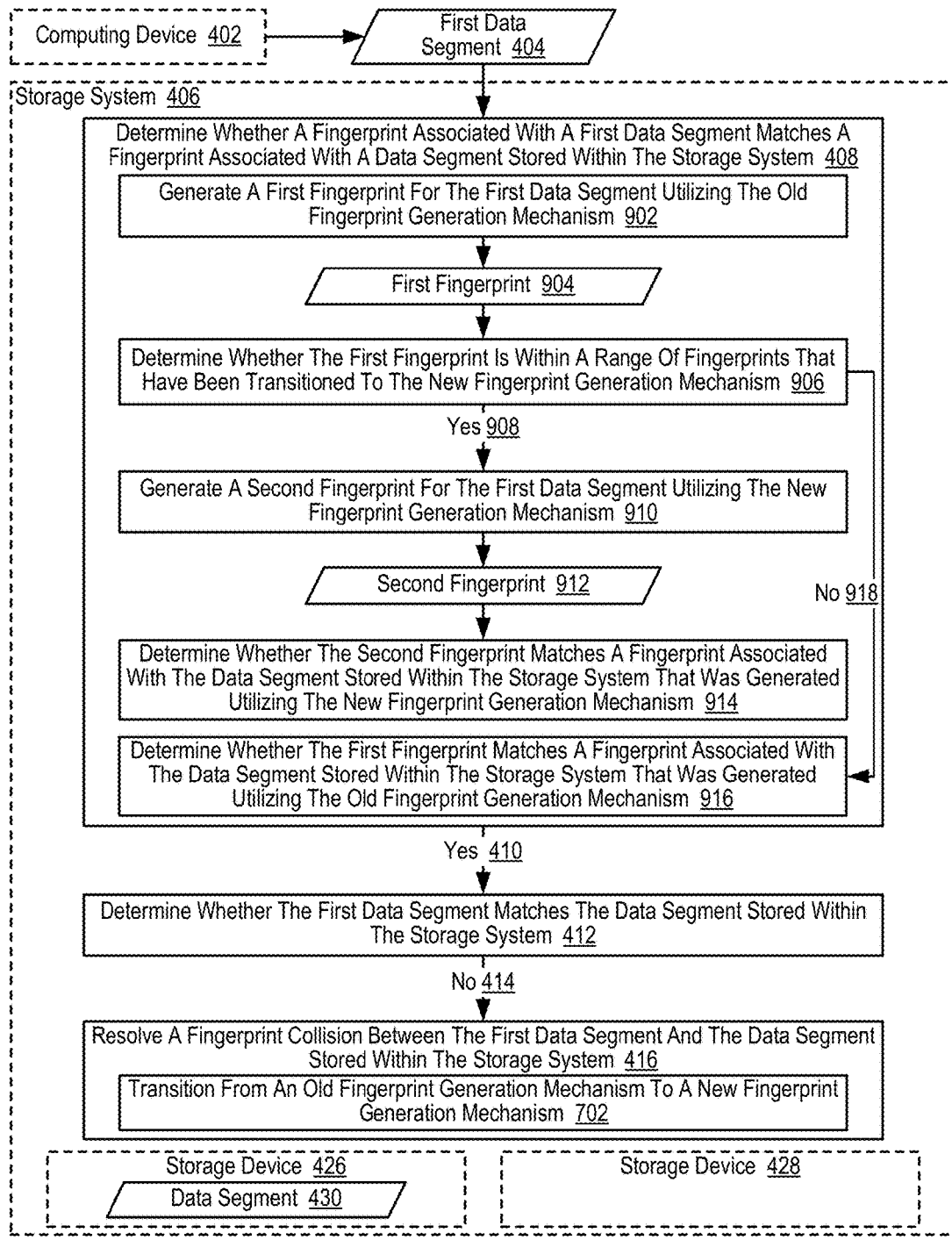
FIG. 9 sets forth a flow chart illustrating an additional example method of handling fingerprint collisions in a storage system that includes one or more storage devices according to some embodiments of the present disclosure.

For further explanation, FIG. 9 sets forth a flow chart illustrating an additional example method of handling fingerprint collisions in a storage system (406) that includes one or more storage devices (426, 428) according to some embodiments of the present disclosure. The example method depicted in FIG. 9 is similar to the example method depicted in FIG. 4, as the example method depicted in FIG. 9 also includes determining (408) whether a fingerprint associated with a first data segment (404) matches a fingerprint associated with a data segment (430) stored within the storage system (406), determining (412) whether the first data segment (404) matches the data segment (430) stored within the storage system (406), and resolving (416) a fingerprint collision between the first data segment (404) and the data segment (430) stored within the storage system (402). The example method depicted in FIG. 9 is also similar to the example method depicted in FIG. 7, as the example method depicted in FIG. 9 also includes transitioning (702) from an old fingerprint generation mechanism to a new fingerprint generation mechanism.

In the example method depicted in FIG. 9, determining (408) whether a fingerprint associated with a first data segment (404) matches a fingerprint associated with a data segment (430) stored within the storage system (406) can include generating (902) a first fingerprint (904) for the first data segment (404) utilizing the old fingerprint generation mechanism. Generating (902) a first fingerprint (904) for the first data segment (404) utilizing the old fingerprint generation mechanism may be carried out, for example, by using the first data segment (404) as input data to a hash function that is used by the old fingerprint generation mechanism. For example, if the old fingerprint generation mechanism generates fingerprints by utilizing an SHA-1 hash function to generate a 160 bit fingerprint, generating (902) a first fingerprint (904) for the first data segment (404) utilizing the old fingerprint generation mechanism may be carried out by using the first data segment (404) as input data to an SHA-1 hash function, and setting the value of the first fingerprint (904) to the resulting 160 bit hash value.

In the example method depicted in FIG. 9, determining (408) whether a fingerprint associated with a first data segment (404) matches a fingerprint associated with a data segment (430) stored within the storage system (406) can also include determining (906) whether the first fingerprint (904) is within a range of fingerprints that have been transitioned to the new fingerprint generation mechanism. As described above, the generation of new fingerprints for data segments that are already stored within the storage system (406) may be a time consuming and resource intensive process. As such, there may be a period of time during which some data segments are associated with fingerprints that were generated using the new fingerprint generation mechanism while other data segments are not yet associated with fingerprints that were generated using the new fingerprint generation mechanism. As the storage system (404) transitions (702) from an old fingerprint generation mechanism to a new fingerprint generation mechanism, the storage system (406) may keep track of which data segments are associated with fingerprints that were generated using the new fingerprint generation mechanism.

Consider an example in which the storage system (404) transitions (702) from an old fingerprint generation mechanism to a new fingerprint generation mechanism one hash bucket at a time. In such an example, a first hash bucket may include all fingerprints that were generated with the old fingerprint generation mechanism that start with a first 24 bit pattern, a second hash bucket may include all fingerprints that were generated with the old fingerprint generation mechanism that start with a second 24 bit pattern, a third hash bucket may include all fingerprints that were generated with the old fingerprint generation mechanism that start with a third 24 bit pattern, and so on. In such an example, the storage system (402) may utilize the new fingerprint generation mechanism to generate new fingerprints for all data segments that map to fingerprints in the first hash bucket, the storage system (402) may subsequently utilize the new fingerprint generation mechanism to generate new fingerprints for all data segments that map to fingerprints in the second hash bucket, and so on. As the storage system (406) completes generating new fingerprints (utilizing the new fingerprint generation mechanism) for each hash bucket, the storage system may maintain a table or other data structure that identifies each hash bucket for which the new fingerprint generation mechanism has been utilized to generate new fingerprints. In such an example, the storage system may therefore compare the first 24 bits of the first fingerprint (904) to determine whether the fingerprint for the first data segment (404) maps to a hash bucket for which the new fingerprint generation mechanism has been utilized to generate new fingerprints. If an evaluation of the first fingerprint (904) affirmatively (908) indicates that the first fingerprint (904) is within a range of fingerprints that have been transitioned to the new fingerprint generation mechanism, the storage system (406) may proceed to the step described in the following paragraph.

In the example method depicted in FIG. 9, determining (408) whether a fingerprint associated with a first data segment (404) matches a fingerprint associated with a data segment (430) stored within the storage system (406) can also include generating (910) a second fingerprint (912) for the first data segment (404) utilizing the new fingerprint generation mechanism. Generating (910) the second fingerprint (912) for the first data segment (404) utilizing the new fingerprint generation mechanism may be carried out, for example, by using the first data segment (404) as input data to a hash function that is used by the new fingerprint generation mechanism. For example, if transitioning (702) from an old fingerprint generation mechanism to a new fingerprint generation mechanism is carried out by transitioning the storage system (406) such that the storage system (406) begins generating fingerprints by utilizing an SHA3-224 hash function to generate a 224 bit fingerprint, generating (910) the second fingerprint (912) for the first data segment (404) utilizing the new fingerprint generation mechanism may be carried out by using the first data segment (404) as input data to an SHA3-224 hash function, and setting the value of the second fingerprint (912) to the resulting 224 bit hash value. In the example method depicted in FIG. 9, generating (910) a second fingerprint (912) for the first data segment (404) utilizing the new fingerprint generation mechanism is carried out in response to affirmatively (908) determining that the first fingerprint (904) is within the range of fingerprints that have been transitioned to the new fingerprint generation mechanism.

In the example method depicted in FIG. 9, determining (408) whether a fingerprint associated with a first data segment (404) matches a fingerprint associated with a data segment (430) stored within the storage system (406) can also include determining (914) whether the second fingerprint (912) matches a fingerprint associated with the data segment (430) stored within the storage system (406) that was generated utilizing the new fingerprint generation mechanism. Determining (914) whether the second fingerprint (912) matches a fingerprint associated with the data segment (430) stored within the storage system (406) that was generated utilizing the new fingerprint generation mechanism may be carried out, for example, by searching a fingerprint table that includes, as part of each entry in the fingerprint table, fingerprints that were generated utilizing the new fingerprint generation mechanism for a plurality of data segments stored within the storage system (406). In such an example, if an entry that contains a fingerprint that is identical to the second fingerprint (912) is found, the storage system (406) may affirmatively (410) determine that the fingerprint associated with the first data segment (404) matches the fingerprint associated with the data segment (430) stored within the storage system (406). If an entry that contains a fingerprint that is identical to the second fingerprint (912) is not found, however, the storage system (406) may determine that the fingerprint associated with the first data segment (404) does not matches the fingerprint associated with the data segment (430) stored within the storage system (406). In the example method depicted in FIG. 9, determining (914) whether the second fingerprint (912) matches a fingerprint associated with the data segment (430) stored within the storage system (406) that was generated utilizing the new fingerprint generation mechanism is also carried out in response to affirmatively (908) determining that the first fingerprint (904) is within the range of fingerprints that have been transitioned to the new fingerprint generation mechanism.

In the example method depicted in FIG. 9, determining (408) whether a fingerprint associated with a first data segment (404) matches a fingerprint associated with a data segment (430) stored within the storage system (406) can also include determining (916) whether the first fingerprint (904) matches a fingerprint associated with the data segment (430) stored within the storage system (406) that was generated utilizing the old fingerprint generation mechanism. Determining (916) whether the first fingerprint (904) matches a fingerprint associated with the data segment (430) stored within the storage system (406) that was generated utilizing the old fingerprint generation mechanism may be carried out, for example, by searching a fingerprint table that includes, as part of each entry in the fingerprint table, fingerprints that were generated utilizing the old fingerprint generation mechanism for a plurality of data segments stored within the storage system (406). In such an example, if an entry that contains a fingerprint that is identical to the first fingerprint (904) is found, the storage system (406) may affirmatively (410) determine that the fingerprint associated with the first data segment (404) matches the fingerprint associated with the data segment (430) stored within the storage system (406). If an entry that contains a fingerprint that is identical to the first fingerprint (904) is not found, however, the storage system (406) may determine that the fingerprint associated with the first data segment (404) does not matches the fingerprint associated with the data segment (430) stored within the storage system (406). In the example method depicted in FIG. 9, determining (916) whether the first fingerprint (904) matches a fingerprint associated with the data segment (430) stored within the storage system (406) that was generated utilizing the old fingerprint generation mechanism may be carried out in response to determining that the first fingerprint (904) is not (918) within the range of fingerprints that have been transitioned to the new fingerprint generation mechanism.

Figure 10:
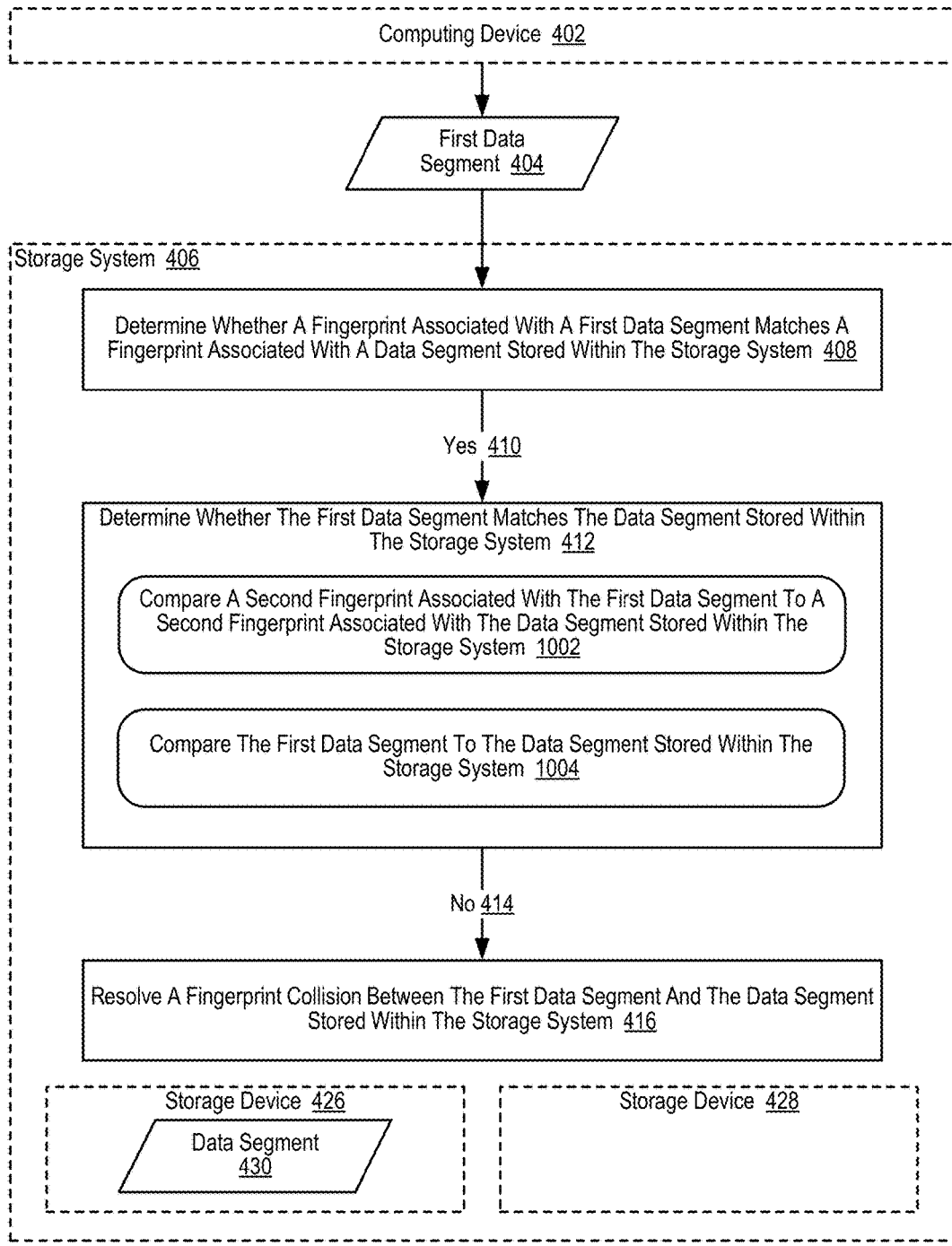
FIG. 10 sets forth a flow chart illustrating an additional example method of handling fingerprint collisions in a storage system that includes one or more storage devices according to some embodiments of the present disclosure.

For further explanation, FIG. 10 sets forth a flow chart illustrating an additional example method of handling fingerprint collisions in a storage system (406) that includes one or more storage devices (426, 428) according to some embodiments of the present disclosure. The example method depicted in FIG. 10 is similar to the example method depicted in FIG. 4, as the example method depicted in FIG. 10 also includes determining (408) whether a fingerprint associated with a first data segment (404) matches a fingerprint associated with a data segment (430) stored within the storage system (406), determining (412) whether the first data segment (404) matches the data segment (430) stored within the storage system (406), and resolving (416) a fingerprint collision between the first data segment (404) and the data segment (430) stored within the storage system (402).

In the example method depicted in FIG. 10, determining (412) whether the first data segment (404) matches the data segment (430) stored within the storage system (406) can include comparing (1002) a second fingerprint associated with the first data segment (404) to a second fingerprint associated with the data segment (430) stored within the storage system (406). Comparing (1002) a second fingerprint associated with the first data segment (404) to a second fingerprint associated with the data segment (430) stored within the storage system (406) may be carried out, for example, by generating an additional fingerprint for each data segment (404, 430) utilizing a fingerprint generation mechanism that is known to be fully resistant to collisions when applied to distinct input data. Once the additional fingerprints have been created for each data segment (404, 430), the two fingerprints may be compared to determine whether the two fingerprints match. If the two fingerprints match, the two data segments (404, 430) may also be identified as matching given that each fingerprint was generated by a generation mechanism that is currently believed to be sufficiently resistant to collisions in practical systems.

In the example method depicted in FIG. 10, determining (412) whether the first data segment (404) matches the data segment (430) stored within the storage system (406) can alternatively include comparing (1004) the first data segment (404) to the data segment (430) stored within the storage system (406). Comparing (1004) the first data segment (404) to the data segment (430) stored within the storage system (406) may be carried out, for example, by performing a bit-by-bit comparison of the two data segments (404, 430). In such an example, any deviation between the two data segments (404, 430) may result in a determination that the two data segments (404, 430) do not match.

Readers will appreciate that although the many of the examples depicted in the Figures described above relate to various embodiments of the present disclosure, other embodiments are well within the scope of the present disclosure. In particular, steps depicted in one figure may be combined with steps depicted in other figures to create permutations of the embodiments expressly called out in the figures. Readers will further appreciate that although the example methods described above are depicted in a way where a series of steps occurs in a particular order, no particular ordering of the steps is required unless explicitly stated.

Example embodiments are described largely in the context of a fully functional computer system for migrating applications executing on a storage system. Readers of skill in the art will recognize, however, that the present disclosure also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method as embodied in a computer program product. Persons skilled in the art will recognize also that, although some of the example embodiments described in this specification are oriented to software installed and executing on computer hardware, nevertheless, alternative embodiments implemented as firmware or as hardware are well within the scope of the present disclosure.

Embodiments can include be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to some embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Readers will appreciate that the steps described herein may be carried out in a variety ways and that no particular ordering is required. It will be further understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. A method of handling fingerprint collisions in a storage system that includes one or more storage devices, the method comprising:
    determining whether a fingerprint associated with a first data segment matches a fingerprint associated with a data segment stored within the storage system, wherein each data segment stored within the storage system is associated with a fingerprint;
    responsive to determining that the fingerprint associated with the first data segment matches the fingerprint associated with the data segment stored within the storage system, determining whether the first data segment matches the data segment stored within the storage system; and
    responsive to determining that the fingerprint associated with the first data segment matches the fingerprint associated with the data segment stored within the storage system and to determining that the first data segment does not match the data segment stored within the storage system, resolving a fingerprint collision between the first data segment and the data segment stored within the storage system.

2. The method of claim 1 wherein resolving a fingerprint collision between the first data segment and the data segment stored within the storage system further comprises modifying the fingerprint associated with the first data segment.

3. The method of claim 1 wherein resolving a fingerprint collision between the first data segment and the data segment stored within the storage system further comprises modifying the fingerprint associated with the data segment stored within the storage system.

4. The method of claim 1 wherein resolving a fingerprint collision between the first data segment and the data segment stored within the storage system further comprises modifying at least one of a mapping of the fingerprint associated with the data segment stored within the storage system and a location within the storage system where the data segment resides.

5. The method of claim 1 wherein resolving a fingerprint collision between the first data segment and the data segment stored within the storage system further comprises transitioning from an old a first fingerprint generation mechanism to a new a second fingerprint generation mechanism.

6. The method of claim 5 wherein determining whether the fingerprint associated with a first data segment matches the fingerprint associated with a data segment stored within the storage system further comprises:
    generating a first fingerprint for the first data segment utilizing the second fingerprint generation mechanism;
    determining whether the first fingerprint matches a fingerprint associated with the data segment stored within the storage system that was generated utilizing the second fingerprint generation mechanism; and
    responsive to determining that the first fingerprint does not match the fingerprint associated with the data segment stored within the storage system that was generated utilizing the second fingerprint generation mechanism:
        generating a second fingerprint for the first data segment utilizing the first fingerprint generation mechanism; and
        determining whether the second fingerprint matches a fingerprint associated with the data segment stored within the storage system that was generated utilizing the first fingerprint generation mechanism.

7. The method of claim 5 wherein determining whether the fingerprint associated with a first data segment matches the fingerprint associated with a data segment stored within the storage system further comprises:
    generating a first fingerprint for the first data segment utilizing the first fingerprint generation mechanism;
    determining whether the first fingerprint is within a range of fingerprints that have been transitioned to the second fingerprint generation mechanism;

responsive to determining that the first fingerprint is within the range of fingerprints that have been transitioned to the second fingerprint generation mechanism:
  generating a second fingerprint for the first data segment utilizing the second fingerprint generation mechanism; and
  determining whether the second fingerprint matches a fingerprint associated with the data segment stored within the storage system that was generated utilizing the second fingerprint generation mechanism; and
responsive to determining that the first fingerprint is not within the range of fingerprints that have been transitioned to the second fingerprint generation mechanism, determining whether the first fingerprint matches a fingerprint associated with the data segment stored within the storage system that was generated utilizing the first fingerprint generation mechanism.

8. The method of claim 1 wherein determining whether the first data segment matches the data segment stored within the storage system further comprises comparing a second fingerprint associated with the first data segment to a second fingerprint associated with the data segment stored within the storage system.

9. The method of claim 1 wherein determining whether the first data segment matches the data segment stored within the storage system further comprises comparing the first data segment to the data segment stored within the storage system.

10. The method of claim 1 wherein determining whether the fingerprint associated with the first data segment matches the fingerprint associated with the data segment stored within the storage system further comprises determining whether the fingerprint associated with the first data segment and the fingerprint associated with the data segment stored within the storage system are within a predetermined tolerance of similarity; wherein:
  predetermined tolerance of similarity may specify a number of bits that two fingerprints can vary by in order to still be identified as matching, a specific range of bits that must be identical in order for the two fingerprints to still be identified as matching, or an amount that two fingerprints by vary by in value to still be identified as matching.

11. A storage system that includes one or more storage devices, the storage system including a computer processor and a computer memory, the computer memory including computer program instructions that, when executed by the computer processor, cause the computer processor to carry out the steps of:
  determining whether a fingerprint associated with a first data segment matches a fingerprint associated with a data segment stored within the storage system, wherein each data segment stored within the storage system is associated with a fingerprint;
  responsive to determining that the fingerprint associated with the first data segment matches the fingerprint associated with the data segment stored within the storage system, determining whether the first data segment matches the data segment stored within the storage system; and
  responsive to determining that the fingerprint associated with the first data segment matches the fingerprint associated with the data segment stored within the storage system and to determining that the first data segment does not match the data segment stored within the storage system, resolving a fingerprint collision between the first data segment and the data segment stored within the storage system.

12. The storage system of claim 11 wherein resolving a fingerprint collision between the first data segment and the data segment stored within the storage system further comprises modifying the fingerprint associated with the first data segment.

13. The storage system of claim 11 wherein resolving a fingerprint collision between the first data segment and the data segment stored within the storage system further comprises modifying the fingerprint associated with the data segment stored within the storage system.

14. The storage system of claim 11 wherein resolving a fingerprint collision between the first data segment and the data segment stored within the storage system further comprises modifying at least one of a mapping of the fingerprint associated with the data segment stored within the storage system and a location within the storage system where the data segment resides.

15. The storage system of claim 11 wherein resolving a fingerprint collision between the first data segment and the data segment stored within the storage system further comprises transitioning from a first fingerprint generation mechanism to a second fingerprint generation mechanism.

16. The storage system of claim 15 wherein determining whether the fingerprint associated with a first data segment matches the fingerprint associated with a data segment stored within the storage system further comprises:
  generating a first fingerprint for the first data segment utilizing the second fingerprint generation mechanism;
  determining whether the first fingerprint matches a fingerprint associated with the data segment stored within the storage system that was generated utilizing the second fingerprint generation mechanism;
  responsive to determining that the first fingerprint does not match the fingerprint associated with the data segment stored within the storage system that was generated utilizing the second fingerprint generation mechanism:
    generating a second fingerprint for the first data segment utilizing the first fingerprint generation mechanism; and
    determining whether the second fingerprint matches a fingerprint associated with the data segment stored within the storage system that was generated utilizing the first fingerprint generation mechanism.

17. The storage system of claim 15 wherein determining whether the fingerprint associated with a first data segment matches the fingerprint associated with a data segment stored within the storage system further comprises:
  generating a first fingerprint for the first data segment utilizing the first fingerprint generation mechanism;
  determining whether the first fingerprint is within a range of fingerprints that have been transitioned to the second fingerprint generation mechanism;
  responsive to determining that the first fingerprint is within the range of fingerprints that have been transitioned to the second fingerprint generation mechanism:
    generating a second fingerprint for the first data segment utilizing the second fingerprint generation mechanism; and
    determining whether the second fingerprint matches a fingerprint associated with the data segment stored within the storage system that was generated utilizing the second fingerprint generation mechanism; and responsive to determining that the first fingerprint is not within the range of fingerprints that have been transitioned to the second fingerprint generation mechanism, determining whether the first fingerprint matches a fingerprint associated with the data segment stored within the storage system that was generated utilizing the first fingerprint generation mechanism.

18. The storage system of claim 11 wherein determining whether the first data segment matches the data segment stored within the storage system further comprises comparing a second fingerprint associated with the first data segment to a second fingerprint associated with the data segment stored within the storage system.

19. The storage system of claim 11 wherein determining whether the first data segment matches the data segment stored within the storage system further comprises comparing the first data segment to the data segment stored within the storage system.

20. The storage system of claim 11 wherein determining whether the fingerprint associated with the first data segment matches the fingerprint associated with the data segment stored within the storage system further comprises determining whether the fingerprint associated with the first data segment and the fingerprint associated with the data segment stored within the storage system are within a predetermined tolerance of similarity; wherein:

predetermined tolerance of similarity may specify a number of bits that two fingerprints can vary by in order to still be identified as matching, a specific range of bits that must be identical in order for the two fingerprints to still be identified as matching, an amount that two fingerprints by vary by in value to still be identified as matching.

* * * * *